(12) United States Patent
Liu et al.

(10) Patent No.: US 12,286,994 B1
(45) Date of Patent: Apr. 29, 2025

(54) RAILLESS MOUNTING DEVICES FOR SECURING SOLAR MODULES TO ROOFS

(71) Applicant: Sunmodo Corporation, Vancouver, WA (US)

(72) Inventors: Jun Liu, Camas, WA (US); Roland Jasmin, Vancouver, WA (US); Steve Mumma, Oregon City, OR (US)

(73) Assignee: Sunmodo Corporation, Vancouver, WA (US)

( * ) Notice: Subject to any disclaimer, the term of this patent is extended or adjusted under 35 U.S.C. 154(b) by 0 days.

(21) Appl. No.: 18/829,205

(22) Filed: Sep. 9, 2024

(51) Int. Cl.
*F16B 2/06* (2006.01)
*H02S 20/23* (2014.01)

(52) U.S. Cl.
CPC ............. *F16B 2/06* (2013.01); *H02S 20/23* (2014.12)

(58) Field of Classification Search
CPC . F16B 2/06; H02S 20/23; H02S 20/22; H02S 20/24; F24S 2025/6004; F24S 25/61
USPC ........................................................ 248/237
See application file for complete search history.

(56) References Cited

U.S. PATENT DOCUMENTS

| | | |
|---|---|---|
| 949,321 A | 2/1910 | Good |
| 1,473,504 A | 11/1923 | Neely |
| 1,568,122 A | 1/1926 | Zifferer |
| 3,100,556 A | 8/1963 | Ridder |
| 4,392,009 A | 7/1983 | Napoli |
| 5,203,135 A | 4/1993 | Bastian |

(Continued)

FOREIGN PATENT DOCUMENTS

| | | |
|---|---|---|
| CH | 713372 B1 | 8/2021 |
| CN | 202363497 U | 8/2012 |

(Continued)

OTHER PUBLICATIONS

ClickFit: Complete Rail-Based Racking System for a variety of roof types, web page snapshot from Mar. 18, 2021 Internet Archive, EcoFasten Solar LLC, Phoenix, Arizona, downloaded from the Internet from https://web.archive.org/web/20210318140918/https://ecofastensolar.com/system/clickfit/ on Nov. 21, 2021.

(Continued)

*Primary Examiner* — Christopher Garft
(74) *Attorney, Agent, or Firm* — Stone Creek Services LLC; Alan M Flum

(57) ABSTRACT

This disclosure discusses railless devices for attaching solar modules to roofs. The devices are designed to snap into detented solar module frames. The devices include end clamps and mid clamps with roof-attachment brackets and module-attachment clamps. The roof-attachment bracket includes a riser extending upward from a base. A threaded aperture extends downward into the riser through the riser-top. The module-attachment clamp is secured over the riser-top by a threaded fastener. The threaded fastener extends through the module-attachment clamp and into the threaded aperture. The module-attachment clamp snaps on to detents in the frame of the solar module. End clamps and mid clamps may be pre-attached to the solar modules at the jobsite to form solar module assemblies that can later be secured to the roof. The structure of the mounting components allows subsequent rows of solar module assemblies to simply snap into previous rows of solar module assemblies.

8 Claims, 22 Drawing Sheets

(56) References Cited

U.S. PATENT DOCUMENTS

| | | |
|---|---|---|
| 6,959,517 B2 | 11/2005 | Poddany et al. |
| D599,034 S | 8/2009 | Placer |
| 7,592,537 B1 | 9/2009 | West |
| 7,774,998 B2 | 8/2010 | Aschenbrenner |
| 8,176,693 B2 | 5/2012 | Abbott et al. |
| 8,387,319 B1 | 3/2013 | Gilles-Gagnon et al. |
| 8,413,944 B2 | 4/2013 | Harberts et al. |
| 8,461,449 B2 | 6/2013 | Kobayashi |
| 8,480,330 B2 | 7/2013 | Urban et al. |
| 8,590,223 B2 | 11/2013 | Kilgore et al. |
| 8,683,761 B2 | 4/2014 | Danning |
| 8,745,936 B2 | 6/2014 | Plaisted et al. |
| 8,806,815 B1 * | 8/2014 | Liu ................... F24S 25/615 52/173.3 |
| 8,875,401 B2 | 11/2014 | Jolley |
| 8,984,818 B2 * | 3/2015 | McPheeters ........... F24S 25/33 52/173.3 |
| 9,010,041 B2 | 4/2015 | Danning |
| 9,057,540 B2 | 6/2015 | Buettner et al. |
| 9,057,542 B2 | 6/2015 | Schuit et al. |
| 9,057,545 B2 | 6/2015 | Stapleton |
| 9,080,792 B2 | 7/2015 | Patton et al. |
| 9,136,411 B2 | 9/2015 | Jolley |
| 9,160,273 B2 | 10/2015 | Schuit et al. |
| 9,193,014 B2 | 11/2015 | Danning |
| 9,249,925 B2 | 2/2016 | Roensch et al. |
| 9,273,708 B2 | 3/2016 | Urban et al. |
| 9,314,904 B2 | 4/2016 | Veloso et al. |
| 9,397,605 B2 | 7/2016 | Stapleton |
| 9,455,662 B2 | 9/2016 | Meine |
| 9,584,062 B2 | 2/2017 | Ganshaw et al. |
| 9,599,280 B2 | 3/2017 | West et al. |
| 9,628,018 B2 | 4/2017 | Stapleton |
| 9,647,433 B2 | 5/2017 | Meine et al. |
| 9,698,724 B2 | 7/2017 | West et al. |
| 9,853,597 B2 | 12/2017 | West |
| 9,876,463 B2 * | 1/2018 | Jasmin ................ F24S 25/636 |
| 9,893,677 B1 * | 2/2018 | Liu ......................... H02S 20/23 |
| 10,033,328 B2 | 7/2018 | Wildes et al. |
| 10,036,577 B2 | 7/2018 | Mascolo et al. |
| 10,177,704 B2 | 1/2019 | Kapla et al. |
| 10,205,418 B2 | 2/2019 | Nayer |
| 10,270,385 B2 | 4/2019 | Xie |
| 10,277,161 B2 | 4/2019 | Tan et al. |
| 10,312,855 B2 | 6/2019 | Lester et al. |
| D853,954 S | 7/2019 | McPheeters |
| 10,381,974 B2 | 8/2019 | McPheeters |
| 10,476,425 B2 | 11/2019 | Stearns et al. |
| 10,622,935 B1 | 4/2020 | Liu |
| 10,749,459 B1 * | 8/2020 | Liu ...................... F16B 5/0685 |
| 10,797,634 B1 * | 10/2020 | Jasmin .................. H02S 30/00 |
| D909,853 S | 2/2021 | Jasmin |
| 11,005,414 B2 | 5/2021 | McDonald et al. |
| 11,146,207 B2 | 10/2021 | Stapleton |
| 11,152,889 B1 | 10/2021 | Affentranger, Jr. et al. |
| 11,251,743 B2 | 2/2022 | Schuit et al. |
| 11,274,855 B2 | 3/2022 | Harris et al. |
| 11,296,648 B1 * | 4/2022 | Jasmin ................. F16B 5/0233 |
| 11,309,831 B2 | 4/2022 | Crook et al. |
| 11,463,040 B2 | 10/2022 | Affentranger, Jr. |
| 11,515,831 B2 | 11/2022 | Affentranger, Jr. et al. |
| 11,552,591 B2 | 1/2023 | Jasmin et al. |
| 11,575,345 B2 | 2/2023 | Affentranger, Jr. |
| D983,015 S | 4/2023 | Jasmin et al. |
| D983,016 S | 4/2023 | Jasmin et al. |
| D983,018 S | 4/2023 | Jasmin et al. |
| 11,621,665 B2 | 4/2023 | Jasmin et al. |
| 11,750,143 B1 * | 9/2023 | Jasmin .................. H02S 20/23 248/237 |
| 11,757,400 B1 * | 9/2023 | Jasmin .................. H02S 20/23 248/237 |
| 11,824,483 B1 | 11/2023 | Affentranger, Jr. |
| 11,881,808 B1 | 1/2024 | Jasmin et al. |
| 11,936,331 B2 * | 3/2024 | Morano ................ F24S 25/613 |
| 12,009,774 B1 * | 6/2024 | Jasmin .................. H02S 30/00 |
| 2008/0203242 A1 | 8/2008 | Buck |
| 2008/0302407 A1 | 12/2008 | Kobayashi |
| 2009/0019796 A1 | 1/2009 | Liebendorfer |
| 2009/0194098 A1 | 8/2009 | Placer |
| 2010/0193012 A1 | 8/2010 | Klammer et al. |
| 2010/0206301 A1 | 8/2010 | Aftanas |
| 2010/0275975 A1 * | 11/2010 | Monschke ............... F24S 25/12 136/251 |
| 2010/0276558 A1 | 11/2010 | Faust et al. |
| 2010/0294340 A1 | 11/2010 | Cunningham et al. |
| 2011/0024582 A1 | 2/2011 | Gies et al. |
| 2011/0209422 A1 | 9/2011 | King et al. |
| 2011/0247295 A1 | 10/2011 | Stearns et al. |
| 2012/0102853 A1 * | 5/2012 | Rizzo ...................... F24S 25/61 52/173.3 |
| 2012/0211252 A1 | 8/2012 | Turziano et al. |
| 2013/0011187 A1 | 1/2013 | Schuit et al. |
| 2013/0118107 A1 | 5/2013 | Maday et al. |
| 2013/0125492 A1 | 5/2013 | Molek et al. |
| 2013/0200245 A1 | 8/2013 | Markiewicz et al. |
| 2013/0340358 A1 | 12/2013 | Danning |
| 2014/0001129 A1 | 1/2014 | Danning |
| 2014/0042286 A1 | 2/2014 | Jaffari |
| 2014/0110543 A1 | 4/2014 | Aliabadi et al. |
| 2014/0174507 A1 | 6/2014 | Jung et al. |
| 2014/0339179 A1 | 11/2014 | West |
| 2014/0353435 A1 | 12/2014 | Liu et al. |
| 2015/0183066 A1 | 7/2015 | Lippert et al. |
| 2015/0240845 A1 | 8/2015 | Mann et al. |
| 2015/0288320 A1 | 10/2015 | Stearns et al. |
| 2015/0357964 A1 | 12/2015 | McPheeters et al. |
| 2016/0043689 A1 | 2/2016 | McPheeters et al. |
| 2016/0111995 A1 | 4/2016 | Nayar |
| 2016/0111997 A1 * | 4/2016 | Ganshaw ................ F24S 25/61 248/224.7 |
| 2016/0134230 A1 | 5/2016 | Meine et al. |
| 2016/0226435 A1 | 8/2016 | Almy et al. |
| 2016/0248367 A1 | 8/2016 | Almy et al. |
| 2016/0248368 A1 | 8/2016 | Seery et al. |
| 2016/0248369 A1 | 8/2016 | Almy |
| 2016/0268965 A1 | 9/2016 | Stearns et al. |
| 2016/0352283 A1 | 12/2016 | Stearns et al. |
| 2017/0025987 A1 | 1/2017 | Stearns et al. |
| 2017/0102167 A1 | 4/2017 | Stephan et al. |
| 2017/0279403 A1 | 9/2017 | Seery et al. |
| 2017/0366131 A1 | 12/2017 | Stearns et al. |
| 2018/0019701 A1 * | 1/2018 | McPheeters .......... F24S 25/636 |
| 2019/0036474 A1 | 1/2019 | Schuit et al. |
| 2019/0068110 A1 * | 2/2019 | McPheeters ............ F24S 25/70 |
| 2019/0093340 A1 | 3/2019 | Meine |
| 2019/0178274 A1 | 6/2019 | Katz |
| 2020/0116191 A1 | 4/2020 | Uppu et al. |
| 2020/0252023 A1 | 8/2020 | Stearns et al. |
| 2020/0259448 A1 | 8/2020 | Schuit et al. |
| 2020/0266757 A1 | 8/2020 | Goldberg et al. |
| 2020/0389122 A1 | 12/2020 | Stephan et al. |
| 2021/0242826 A1 | 8/2021 | Basarich et al. |
| 2021/0265939 A1 | 8/2021 | De Bie |
| 2021/0285596 A1 * | 9/2021 | Affentranger, Jr. ..... F16M 13/02 |
| 2021/0285689 A1 * | 9/2021 | Affentranger, Jr. ..... F16J 15/104 |
| 2022/0082207 A1 | 3/2022 | Gumaer |
| 2022/0094299 A1 | 3/2022 | Wang et al. |
| 2022/0221195 A1 | 7/2022 | Affentranger, Jr. et al. |
| 2022/0345074 A1 | 10/2022 | Neal et al. |
| 2022/0368277 A1 | 11/2022 | Jasmin et al. |
| 2023/0216441 A1 | 7/2023 | Neal et al. |
| 2024/0167730 A1 | 5/2024 | Jasmin et al. |
| 2024/0171115 A1 | 5/2024 | Jasmin et al. |
| 2024/0333203 A1 * | 10/2024 | Kobayashi .............. H02S 20/30 |

FOREIGN PATENT DOCUMENTS

| | | |
|---|---|---|
| CN | 103280473 A | 9/2013 |
| CN | 203562992 U | 4/2014 |
| CN | 203942481 U | 11/2014 |
| CN | 205566178 U | 9/2016 |
| CN | 106788191 A | 5/2017 |
| CN | 206251017 U | 6/2017 |
| CN | 107248841 A | 10/2017 |

(56) References Cited

FOREIGN PATENT DOCUMENTS

| | | |
|---|---|---|
| CN | 206575356 U | 10/2017 |
| CN | 206575358 U | 10/2017 |
| CN | 105141240 B | 12/2017 |
| CN | 210129839 U | 3/2020 |
| CN | 112165299 A | 1/2021 |
| CN | 213402923 U | 6/2021 |
| CN | 113179083 A | 7/2021 |
| CN | 113794431 A | 12/2021 |
| DE | 102011076971 A1 | 12/2012 |
| DE | 102012007535 A1 | 10/2013 |
| DE | 202014004487 U1 | 9/2015 |
| ES | 211089 U | 5/1976 |
| JP | 2011237030 A | 11/2011 |
| JP | 2013163951 A | 8/2013 |
| KR | 20110058294 A | 6/2011 |
| TW | M539609 U | 4/2017 |
| WO | 2010074701 A1 | 7/2010 |
| WO | 2013163667 A1 | 11/2013 |
| WO | 2016157692 A1 | 10/2016 |
| WO | 2017027758 A2 | 2/2017 |
| WO | 2020162746 A1 | 8/2020 |
| WO | 2021061866 A1 | 4/2021 |
| WO | 2022169989 A1 | 8/2022 |
| WO | 2022197973 A1 | 9/2022 |
| WO | 2022240909 A1 | 11/2022 |
| WO | 2023028101 A1 | 3/2023 |
| WO | 2023192199 A2 | 10/2023 |

OTHER PUBLICATIONS

Composition Mount with Leading Edge T-Clamp and Integrated Grounding Installation Manual, Sep. 2017, Sol Attach, LLC, New Braunfels, Texas.

EcoFasten ClickFit Installation Guide, V. 2.3, Dec. 9, 2020, EcoFasten Solar LLC, Phoenix, Arizona.

EcoFasten The Rail-less Mounting System Rockit, Jul. 8, 2020, EcoFasten Solar LLC, Phoenix, Arizona (a division of Rillito River Solar, LLC).

Evaluation of Installation Time for SMASHmount by SMASHsolar, Apr. 2017, National Renewable Energy Laboratory (NREL), Golden, Colorado.

Extended European Search Report, European Patent Application No. EP 23169417, Applicant: Sunmodo Corporation, Date of Action: Jan. 29, 2024, European Patent Office, Munich, Germany.

European Examination Report, European Patent Application No. EP 23169417, Applicant: Sunmodo Corporation, Date of Action: Jul. 9, 2024, European Patent Office, Munich, Germany.

GridFlex Installation Guide, Unirac Cod-Compliant Installation Manual, Document No. PUB19JAN2022, Publication Date: Jan. 2022, Unirac, Inc., Albuquerque, New Mexico.

Kelly Pickerel, Monarc Solar launches pre-assembled, pre-wired solar array, Jul. 20, 2015, Solar Power World, downloaded from the Internet from https://www.solarpowerworldonline.com/2015/07/monarc-solar-launches-pre-assembled-pre-wired-solar-array/ on Jul. 31, 2022.

Kelly Pickerel, New mounting system provides quick way to install frameless panels on residential roofs, Dec. 15, 2016, Solar Power World, downloaded from the Internet from https://www.solarpowerworldonline.com/2016/12/new-mounting-system-provides-quick-way-install-bifacial-panels-residential-roofs/ on Jul. 31, 2022.

Lumeta Lynx 72, Version LYNX72_Data_Sheet_0318_Prelim, Mar. 2018, Lumeta Solar, Emeryville, California.

Module Level Power Electronics Bracket, Nov. 2018, Pegasus Solar, downloaded from the Internet from https://www.pegasussolar.com/wp-content/uploads/2018/11/Pegasus-Universal-MLPE-Data-Sheet-2.14.18.pdf on Jul. 21, 2022.

NanoRack System Product Installation Manual, Document No. D10252-V1.54, Sep. 20, 2023, Sunmodo Corporation, Vancouver, Washington.

NanoRack Data Sheet, Document No. D10261-V001, Sep. 20, 2023, Sunmodo Corporation, Vancouver, Washington.

NanoRack One-Sheet, Sep. 20, 2023, Sunmodo Corporation, Vancouver, Washington.

NanoRack Overview webpage: https://sunmodo.com/nanorack/, Public publication date: Sep. 19, 2024, Sunmodo Corporation, Vancouver, Washington, downloaded from the Internet from the Internet Archive, from http://web.archive.org/web/20230922112226/https://sunmodo.com/nanorack/ on Aug. 5, 2024, Internet Archive capture date::Sep. 22, 2023.

Solar Power International Tradeshow, Las Vegas, Nevada, Sep. 11-14, 2023, public showing by Sunmodo Corporation of components described on NanoRack Overview web page.

NXT UMOUNT, Part & Assembly Drawings, Nov. 2022, Unirac, Albuquerque, New Mexico.

SMR System Data Sheet, Document No. D10225-V001, Sep. 2020, Sunmodo Corporation, Vancouver, Washington.

SnapNrack Solar Mounting Solutions Ultra Rail Residential PV Mounting Systems Installation Manual, Jan. 2019, SnapNrack, San Luis Obispo, California (a subsidiary of Sunrun Inc.).

SnapNrack Solar Mounting Solutions, Ultra Rail Residential Roof Mount System Installation Manual, v. 3.2, Jan. 2021, pp. 52-55, SnapNRack, Inc., San Luis Obispo, California (a division of Sunrun, Inc.).

SnapNRack Ultra Rail Comp Kit Drawing Set, Revision B, Feb. 2019, SnapNrack, San Luis Obispo, California (a subsidiary of Sunrun Inc.).

SnapNRack Ultra Rail Mounting Hardware Drawing Set, Revision A, Jan. 2018, SnapNrack, San Luis Obispo, California (a subsidiary of Sunrun Inc.).

SnapNRack Ultra Rail Tile Hook F Drawing Set, Jan. 2019, SnapNrack, San Luis Obispo, California (a subsidiary of Sunrun Inc.).

SnapNRack UR-60 Splice Drawing Set May 2019, SnapNrack, San Luis Obispo, California (a subsidiary of Sunrun Inc.).

Solar's Fastest Attachment NanoMount, Feb. 2020, Sunmodo Corp., Vancouver, Washington.

Unirac Roof Mount RM Universal Module Clamp—310750, downloaded from the Internet from https://www.solarpanelstore.com/products/unirac-rm-universal-module-clamp on Feb. 8, 2023.

Unpublished U.S. Appl. No. 18/763,527, filed Jul. 3, 2024, Inventors: Roland Jasmin, Steve Mumma, and Jun Liu, Assigned to Sunmodo Corporation.

* cited by examiner

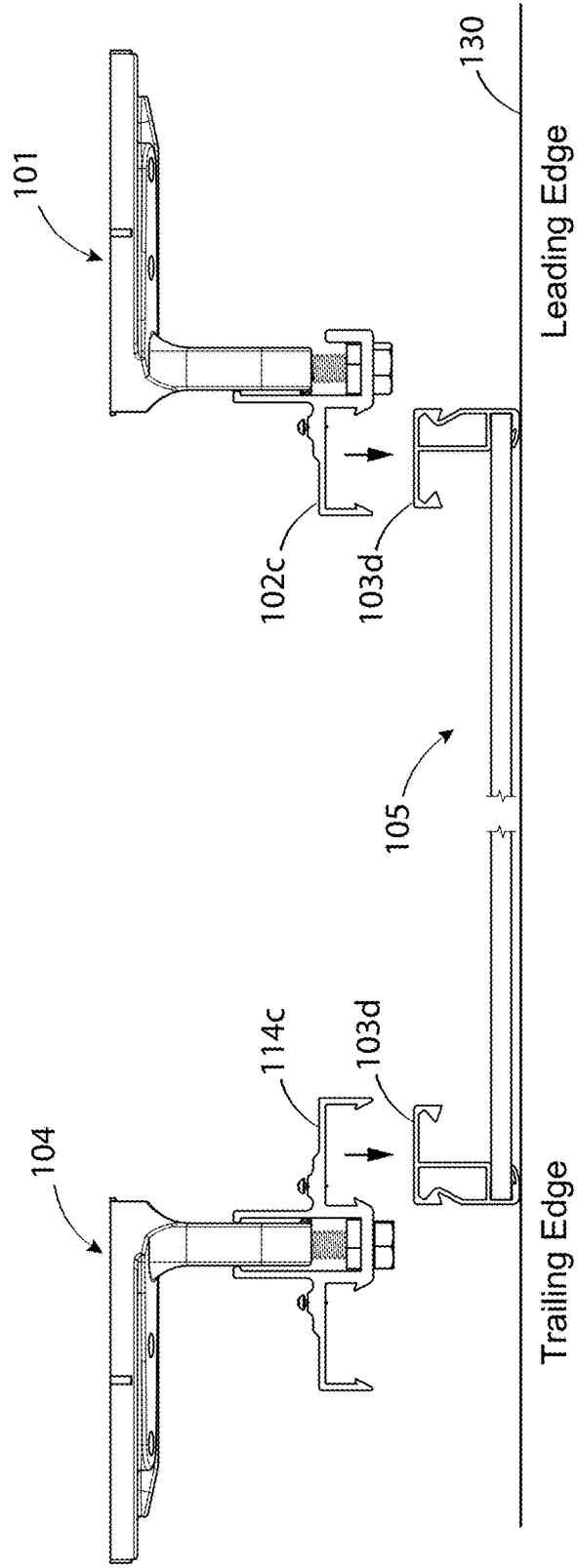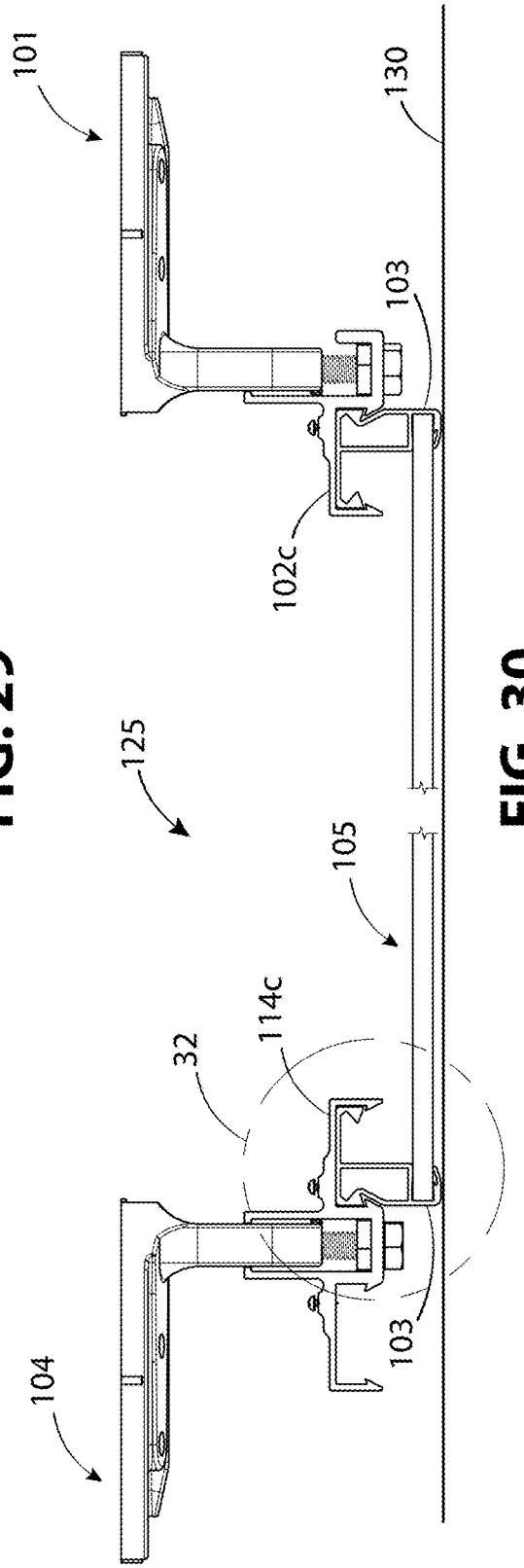

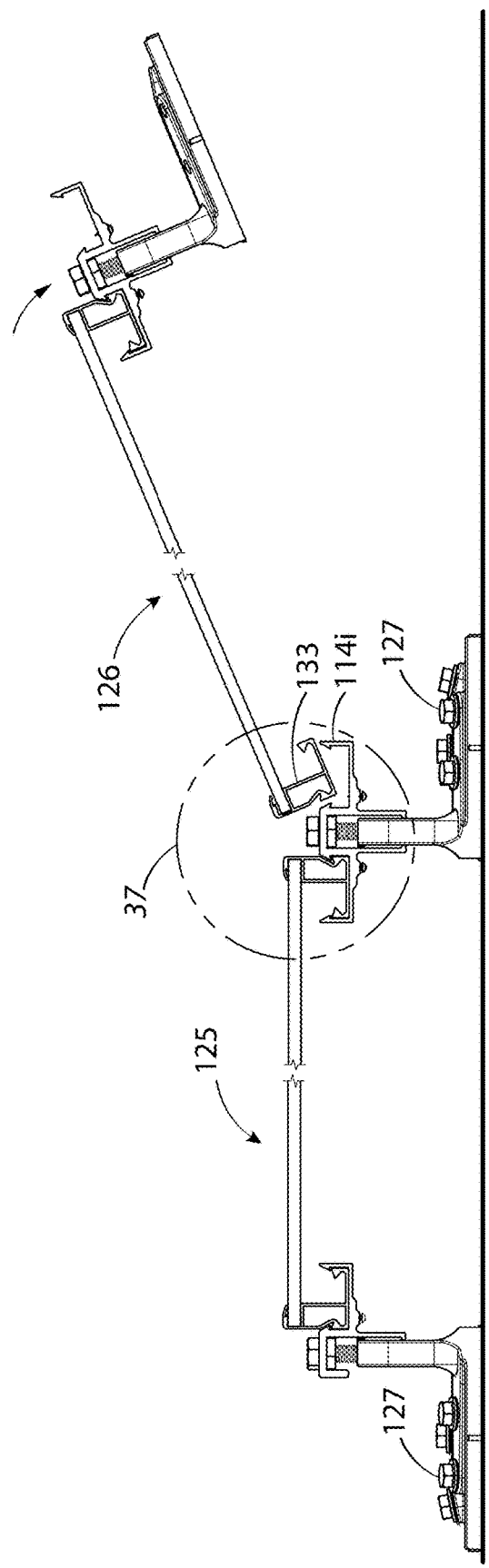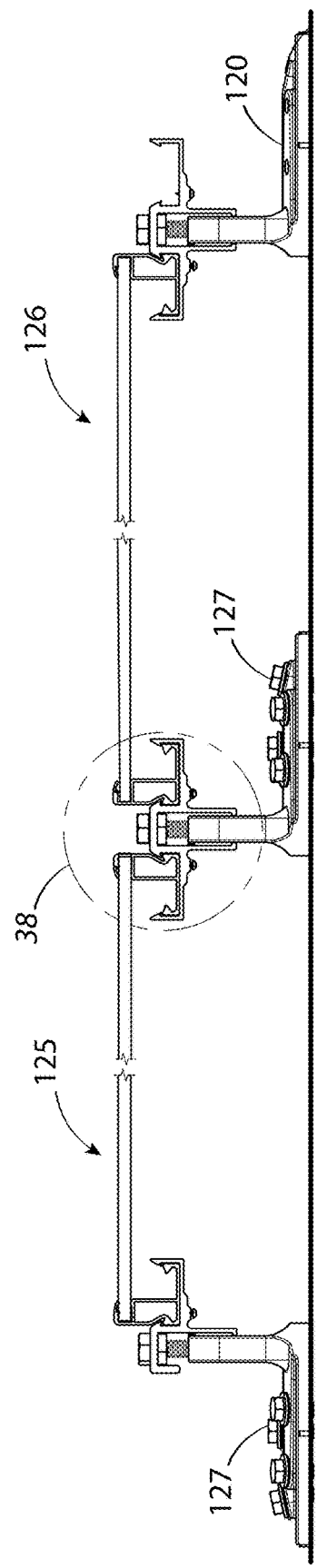

RAILLESS MOUNTING DEVICES FOR SECURING SOLAR MODULES TO ROOFS

BACKGROUND

This application relates to structures and devices for mounting solar energy collecting apparatus such as solar modules. These structures and devices may be attached to or integrated into static structures, such as buildings and roof tops.

Solar modules, or solar panels, are often mounted to building roof tops using solar "mounting" or "racking" systems. These mounting systems can be rail-based or railless. Some roof tops are sloped or "pitched," to help shed rain. Both rail-based and railless mounting systems can accommodate pitched roofs.

Rail-based mounting systems use rails to support the solar modules. Module clamps typically secure the solar modules to the rails. The rails may be secured to the building surface, or roof top, using L-brackets.

Railless mounting systems do not use rails. Instead, railless mounting assemblies attach directly to the solar modules and the roof. Because they do not use rails, railless mounting assemblies typically require less mounting hardware than rail-based systems.

SUMMARY

The Inventors recognized that while railless mounting systems generally use less mounting hardware than rail-based systems, the railless mounting assemblies can be structurally complex. They can also be difficult to install, requiring pre-planning and complex adjustment. In addition, once the modules are positioned on the roof surface, it is often difficult to adjust the height of the solar modules. Access to the height-adjustment mechanism may be restricted because of their position relative to the installed solar modules.

The Inventors' solar module mounting system, and associated devices, solve these problems. The system integrates with solar modules that have solar module frames, which include a first detent in the outward-facing surface of their frame and a second detent extending from the return flange of the solar module frame. Examples of a solar module using a frame with these features is the subject U.S. Pat. Nos. 11,757,400, issued on Sep. 12, 2023 and U.S. Pat. No. 11,881,808 issued on Jan. 23, 2024, the contents of which are hereby incorporated by reference.

Integrating the solar module mounting system with solar module frames as described above, simplifies the structure of mounting components and devices. For example, the mounting components share structure that allows them to snap into detents in the solar module frame by spring tension without the use of tools. The mounting components may be pre-attached to the solar module before the resulting solar module assembly is positioned and secured to the roof. In contrast, a typical solar module system requires that the mounting component first be attached to the roof, and then the solar modules be aligned and attached to the mounting components. This requires somewhat precise measurement and pre-calculation and is prone to error. The present system, on the other hand, may be mounted directly to the roof. An installer may opt to use a reference, such as a chalk line to align the first row of solar module assemblies to the roof. The structure of the mounting components allows subsequent rows of solar module assemblies to simply snap into previous rows of solar module assemblies. Because the mounting components are pre-attached to the solar modules, there is little or no chance of misalignment.

The mounting components include end clamps, mid clamps, and a bonding splice. The end clamps are structured to attach to an outside perimeter edge of the solar module assembly. The mid clamps are structured to attach between adjacent modules and secure them together.

The end clamps and mid clamps may include a module-attachment clamp and a roof-attachment bracket. The module-attachment clamp is structured to seat and secure the frame of the solar module. The roof-attachment bracket is structured to secure the module-attachment clamp to the roof.

The module-attachment clamp includes a clamping portion with hooks that clamp the detents on the frame of the solar module. The clamping portion also includes a module-receiving platform that seats the return flange of the clamped frame. The hooks may be on the end of clamp arms that extend up from the module-receiving platform. One of the clamps arms is designed to hinge during installation of the solar module frame, allowing the solar module to snap into place.

Traditionally, solar module mounting devices adjust the height of the solar modules by moving a threaded fastener up or down in a slotted-opening in an L-bracket. The threaded fastener is attached to the module clamping mechanism. The Inventors observed that once the modules are in place, this clamping mechanism is generally under the solar modules and difficult to access. The Inventors developed a height-adjustment mechanism that solves this problem by accessing the height adjustment mechanism from above the modules. A threaded fastener extends through a bracket-attachment portion of the module-attachment clamp and into a threaded aperture in the roof-attachment bracket. The threaded aperture extends downward through a riser-top and into the riser of the roof-attachment bracket. Tightening or loosening the threaded fastener moves the module-attachment clamp, up or down, respectively, relative to the roof-attachment bracket.

This Summary discusses various examples and concepts. These do not limit the inventive concept. Other features and advantages can be understood from the Detailed Description, figures, and claims.

BRIEF DESCRIPTION OF DRAWINGS

FIGS. 28-30 illustrate, in various views, the assembly steps for creating a first-row module assembly.

FIGS. 36 and 37, illustrate the assembly steps for attaching a non-first-row module assembly to a previous row.

DETAILED DESCRIPTION

The Detailed Description and Claims may use ordinals such as "first," "second," or "third," to differentiate between similarly named parts. These ordinals do not imply order, preference, or importance. This disclosure uses "optional" to describe features or structures that are optional. Not using the word "optional" does not imply a feature or structure is not optional. In this disclosure, "or" is an "inclusive or," unless preceded by a qualifier, such as "either," which signals an "exclusive or." As used throughout this disclosure, "comprise," "include," "including," "have," "having," "contain," "containing" or "with" are inclusive, or open ended, and do not exclude unrecited elements. The terms "secure" and "attach" are used interchangeably.

The Detailed Description includes the following sections: "Definitions," "Overview," "Common Features," "Components," "Example Assembly Method," and "Conclusion and Variations."

Definitions

Return flange: As defined in this disclosure, a return flange is the lower lip of a solar module frame that projects inward underneath the solar module.

Overview

As discussed in the Summary, the Inventors recognized that while railless systems generally use less mounting hardware than rail-based systems, the railless mounting assemblies can be structurally complex. They can also be difficult to install, requiring pre-planning and complex adjustment. In addition, the Inventors observed that once solar modules are placed on the roof, depending on their location, it may be difficult to adjust the height of the solar modules.

Figure 1:
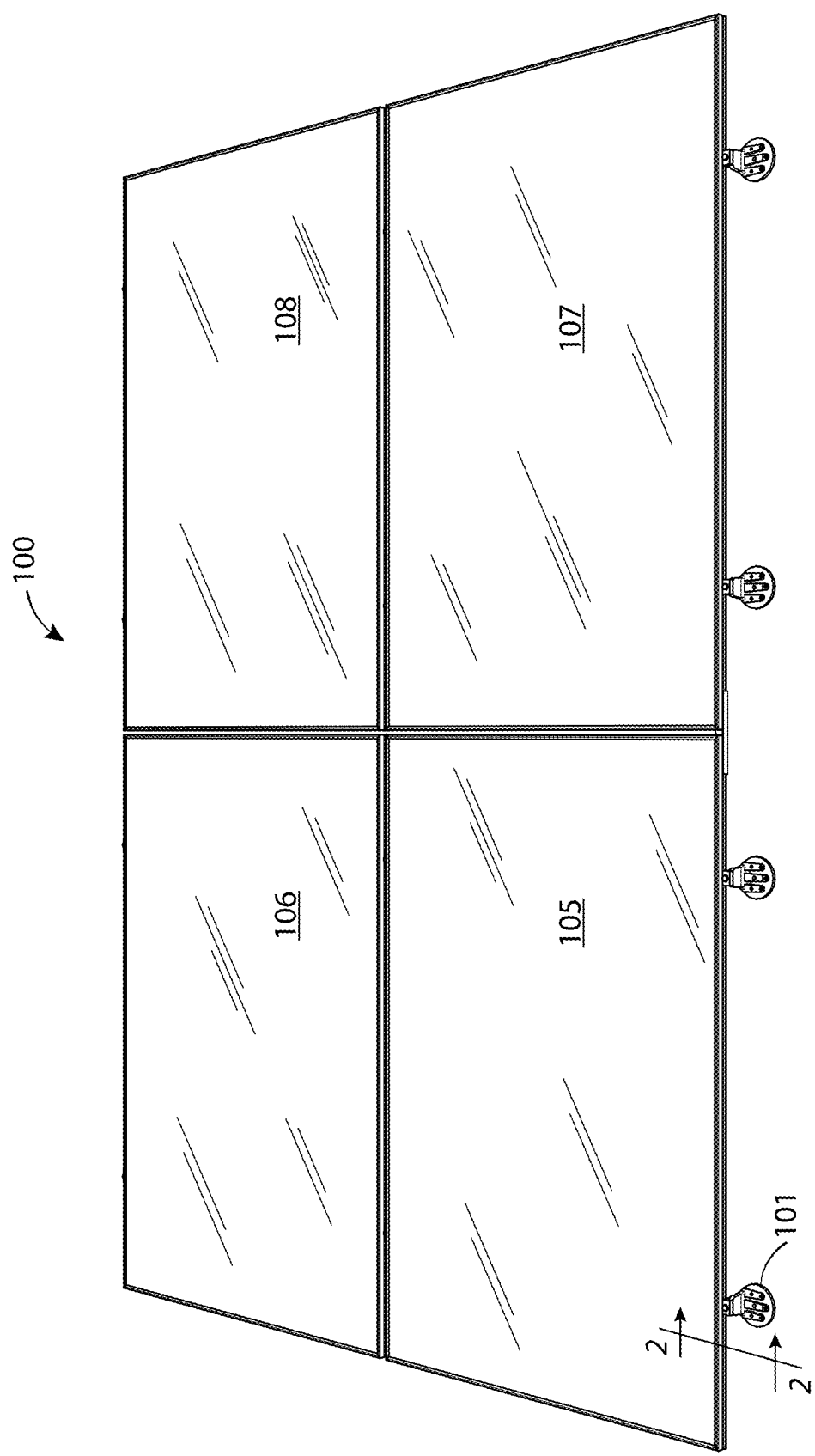
FIG. 1 illustrates, in front perspective view, a simplified version of a solar module assembly of the present disclosure.
Figure 2:
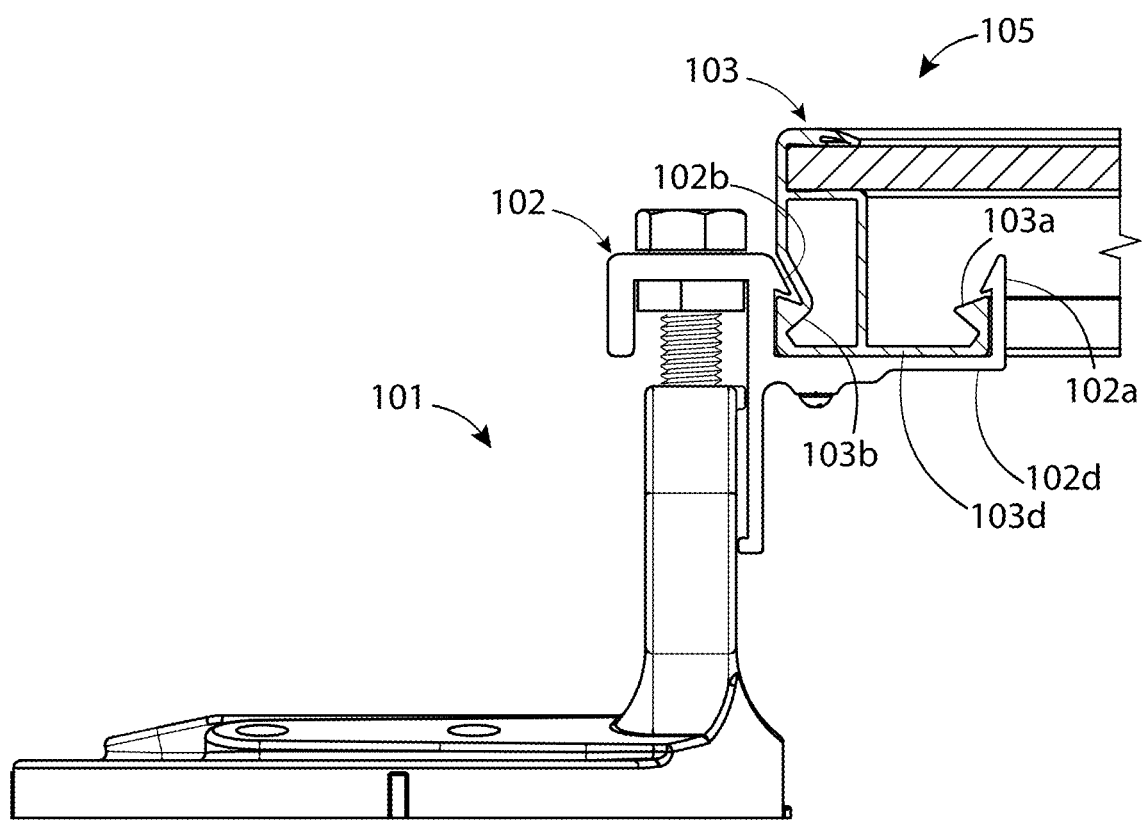
FIG. 2 illustrates a section of FIG. 1 taken along section lines 2-2.

The Inventors' railless solar module system and associated devices, components, and methods solve these problems. The system integrates with solar modules that have detented solar module frames. These frames may include a first detent in the outward-facing surface of their frame and a second detent extending from the return flange of the solar module frame. As an example, FIG. 1 illustrates, in front perspective view, a solar module system 100 that represents a simplified version of the Inventor's system. FIG. 2 illustrates a section of a mounting component, end clamp 101 of FIG. 1, along with a section of the solar module 105. Referring to FIG. 2, a first hook 102a, and a second hook 102b, engages a first detent 103a and a second detent 103b, respectively. The first detent 103a and the second detent 103b are of frame 103, of solar module 105. The first hook 102a and the second hook 102b are of the module-attachment clamp 102, of the end clamp 101. The frame 103 surrounds the module body and forms the outside peripheral boundary of the solar module 105. The module body is the portion of the solar module that includes the solar cells, a substrate, and a protective glass cover. Integrating the solar module mounting system with solar module frames as described above, simplifies the structure of mounting components and devices. The mounting components described within this disclosure include structure that allows them to snap into detents in the solar module frame, by spring tension, without the use of tools. This will be discussed for FIGS. 31 and 32.

Figure 3:
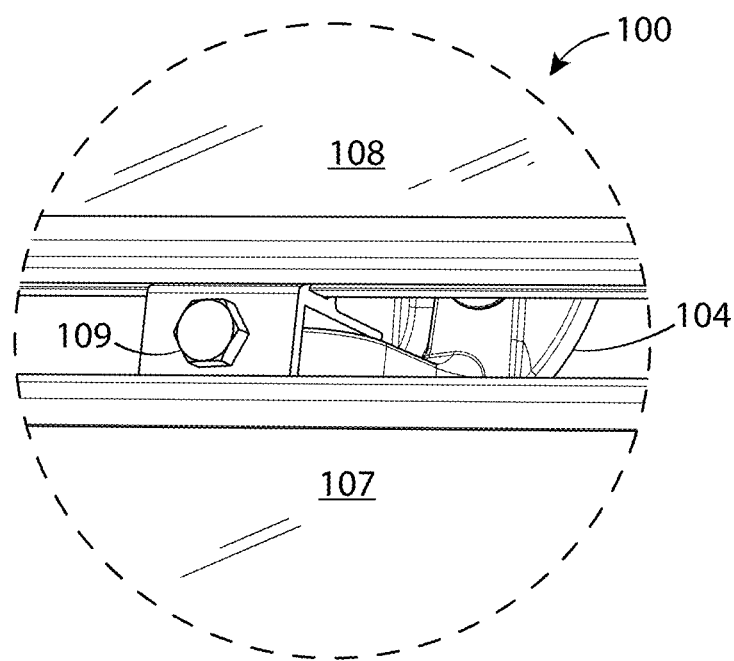
FIG. 3 illustrates an enlarged view of a mid clamp attached to adjacent solar modules of FIG. 4, illustrating access to height adjustment from above the adjacent solar modules.

Traditionally, solar module mounting devices adjust the height of the solar modules by moving a threaded fastener attached to the module clamping mechanism within a slotted-opening in an L-bracket. The Inventors observed that once the modules are in place, this clamping mechanism is generally under the solar modules and difficult to access. The Inventors developed a height-adjustment mechanism that solves this problem by accessing height adjustment from above the modules. FIG. 3, illustrates, in top perspective view, an enlarged portion of the solar module system 100, illustrating an adjustment mechanism attached to a mid clamp 104. The mid clamp 104 is positioned between two solar modules, solar module 107, and solar module 108. A threaded fastener 109 extends through the top of the mid clamp 104. The threaded fastener 109, which is accessible from above the solar modules, facilitates height adjustment of solar module 107 and solar module 108. This allows for accessible adjustment of the solar module height after the solar modules are installed.

Figure 4:
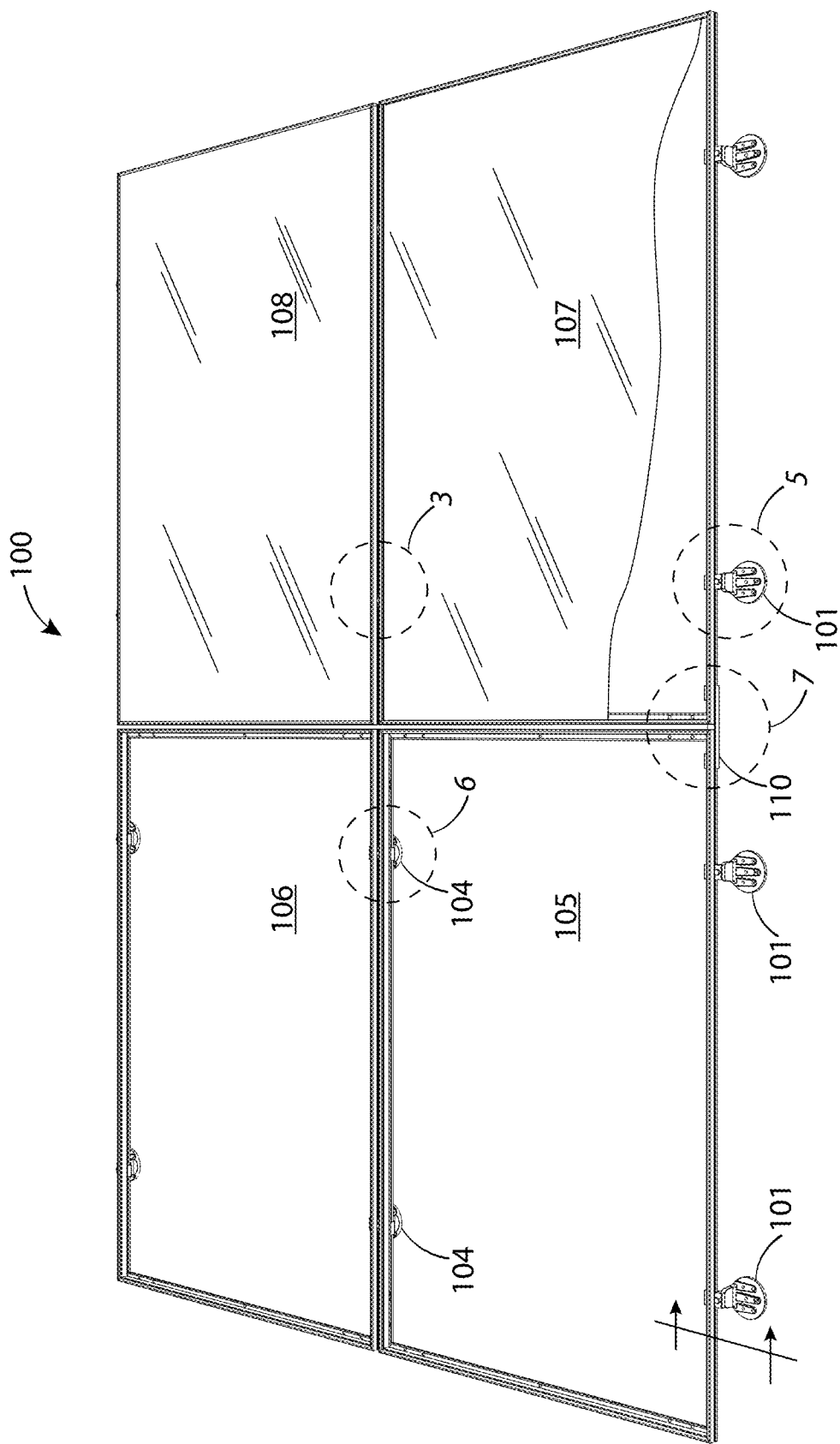
FIG. 4 illustrates, in front perspective view, the solar module assembly of FIG. 1, with some of the solar module bodies cutaway or made transparent (x-ray view), to show the components beneath.

FIG. 4 illustrates, in front perspective view, the solar module system 100 of FIG. 1. Portions of the module body of solar module 107 are cutaway. To view the structure beneath, the module bodies of solar module 105 and solar module 106 are illustrated as transparent (i.e., x-ray view). FIG. 4 illustrates multiple instances of the end clamp 101 and mid clamp 104. The solar module system 100 may optionally include a bonding splice 110. The end clamp 101 is structured to attach to an outside perimeter edge of the solar module assembly. The mid clamp 104 is structured to attach between adjacent modules and secure them together.

Figure 5:
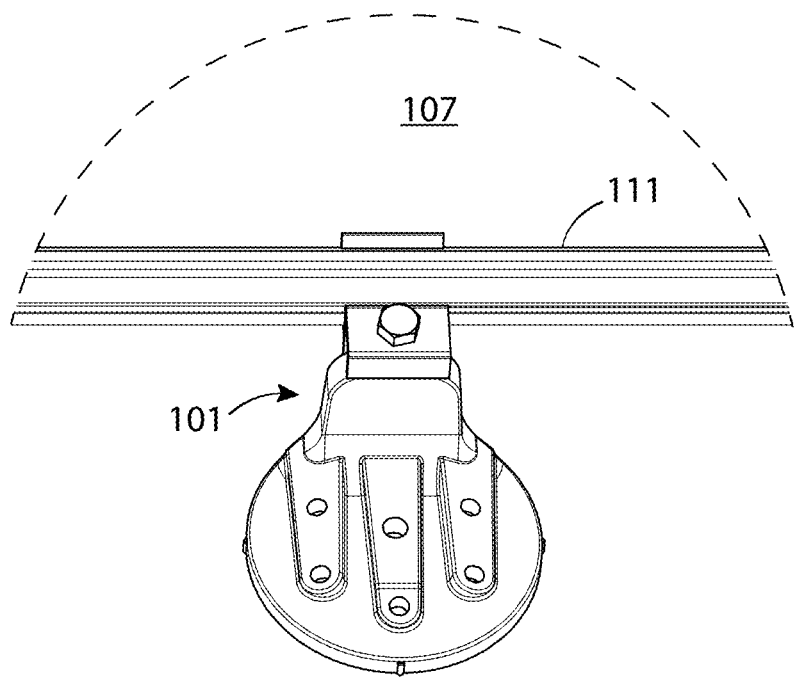
FIGS. 5, 6, and 7 illustrate an enlarged view of the end clamp, the mid clamp, and the bonding splice, respectively, of FIG. 4.
Figure 6:
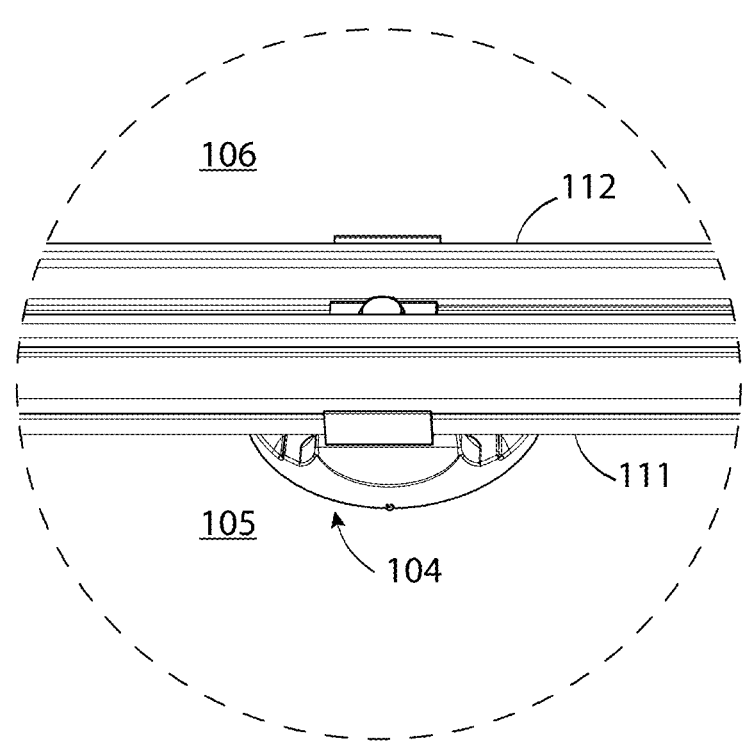
Figure 7:
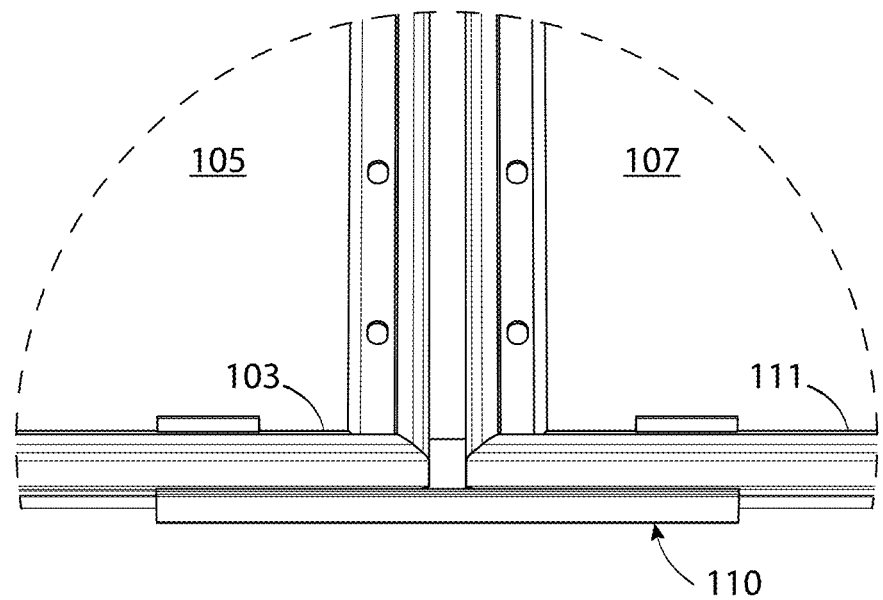

FIGS. 5, 6, and 7 illustrate an enlarged view of the end clamp 101, the mid clamp 104, and the bonding splice 110, respectively, of FIG. 4. In FIG. 5, the end clamp 101 is secured to the frame 111 of the solar module 107. In FIG. 6, the mid clamp 104 is secured to the frame 111 and frame 112 of solar module 105 and solar module 106, respectively. Referring to FIG. 7, the bonding splice 110 is secured to the frame 103 of solar module 105 and the frame 111 of solar module 107.

Referring to FIG. 2, the end clamp 101, the mid clamp 104, and the bonding splice 110, share a common clamping mechanism. This clamping mechanism will be discussed in detail for FIGS. 8-10. The end clamp 101 and the mid clamp 104 share a common roof-attachment bracket. The roof-attachment bracket 120 will be discussed in detail for FIGS. 11-13. The height-adjustment mechanism will be discussed in FIGS. 14-19. FIGS. 20-22, FIGS. 23-25, and FIGS. 26-27 illustrate the end clamp 101, the mid clamp 104, and the bonding splice 110, respectively, in further detail. The remaining figures, FIGS. 28-39, illustrate a non-limiting example of a typical assembly method.

FIGS. 1 and 4 illustrate a four-module system with four solar modules, solar module 105, solar module 106, solar module 107, and solar module 108. Using the principles discussed in this disclosure, the solar module system 100 is scalable to significantly larger systems. As a non-limiting example, using the disclosed principles, it is possible to construct residential solar module systems with hundreds of solar modules.

Common Features

Figure 8:
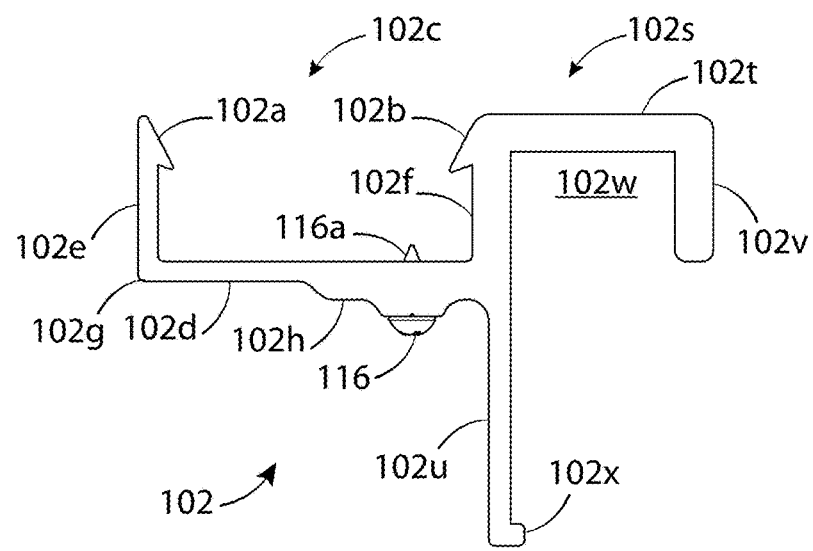
FIGS. 8, 9, and 10, illustrate, in side view, the module-attachment clamp for the end clamp, the module-attachment clamp for the mid clamp, and the splice body of the bonding splice, respectively.
Figure 9:
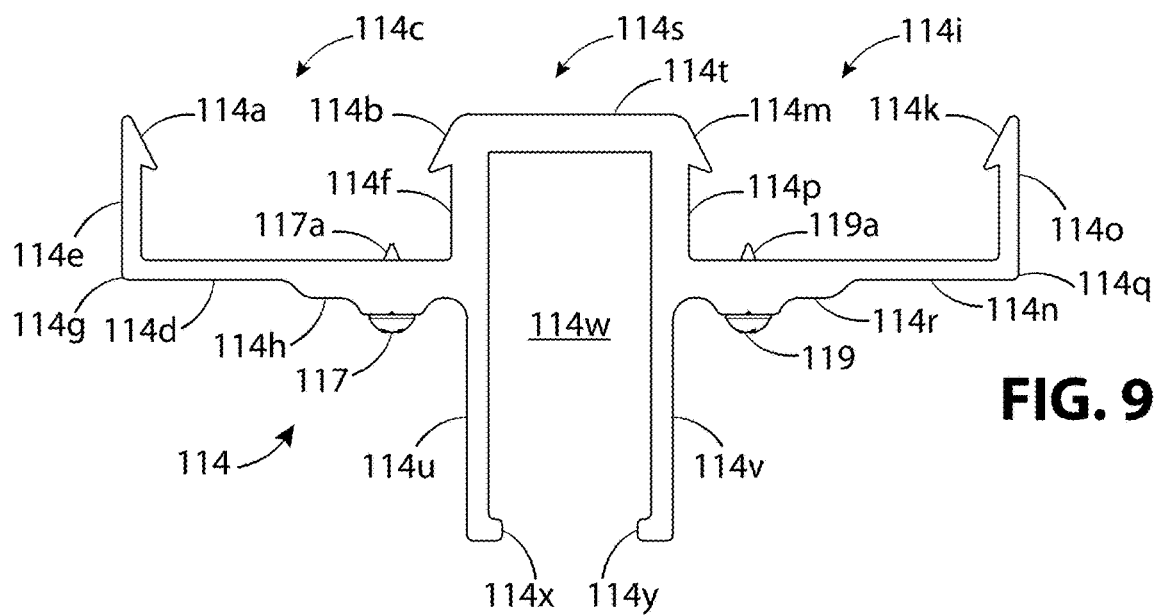
Figure 10:
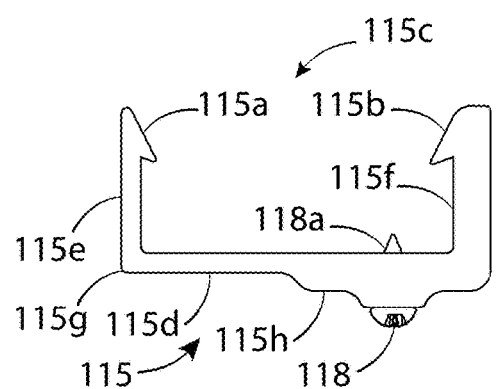

FIG. 8 illustrates, in side view, the module-attachment clamp 102 of the end clamp 101 of FIG. 2. FIG. 9 illustrates module-attachment clamp 114 of the mid clamp 104 of FIG. 2. FIG. 10 illustrates splice body 115 of the bonding splice 110 of FIG. 2. The module-attachment clamp 102 of FIG. 8, module-attachment clamp 114 of FIG. 9, and splice body 115 of FIG. 10, include clamping portions that share similar structure and principles of operation. The clamping portion of these components are structured to secure the module-attachment clamp to the frame of the solar module.

As illustrated in a non-limiting example, referring to FIG. 8, the clamping portion 102c may include a module-receiving platform 102d, a first clamp arm 102e, a second clamp arm 102f, a first hook 102a, and a second hook 102b. The first hook 102a may extend downward from a first end of the first clamp arm 102e toward the module-receiving platform 102d. The second hook 102b may extend downward from a second end of the second clamp arm 102f toward the module-receiving platform 102d. The first clamp arm 102e and the second clamp arm 102f extend upward from the module-receiving platform 102d.

Referring to FIG. 9, the clamping portion 114c may include a module-receiving platform 114d, a first clamp arm 114e, a second clamp arm 114f, a first hook 114a, and a second hook 114b. The first hook 114a may extend downward from a first end of the first clamp arm 114e toward the module-receiving platform 114d. The second hook 114b, may extend downward from a second end of the second clamp arm 114f, toward the module-receiving platform 114d. The first clamp arm 114e and the second clamp arm 114f extend upward from the module-receiving platform 114d.

Referring to FIG. 10, the first clamping portion 115c may include a module-receiving platform 115d, a first clamp arm 115e, a second clamp arm 115f, a first hook 115a, and a second hook 115b. The first hook 115a may extend downward from a first end of the first clamp arm 115e toward the module-receiving platform 115d. The second hook 115b may extend downward from a second end of the second clamp arm 115f toward the module-receiving platform 115d. The first clamp arm 115e and the second clamp arm 115f extend upward from the module-receiving platform 115d.

In FIGS. 8, 9, and 10, the module-receiving platform, in combination with the first clamp arm and the second clamp arm, seat and secure the solar module. For example, referring to FIG. 2, the module-receiving platform 102d seats the return flange 103d of solar module 105. The first hook 102a and second hook 102b, clamp the frame 103 by spring tension against the first detent 103a and second detent 103b, respectively. The hooked-shape of the first hook 102a and the second hook 102b prevent the solar module 105 from pulling up out of the detents.

Referring to FIG. 8, the first clamp arm 102e is thinner than the second clamp arm 102f. In addition, the corner junction between the module-receiving platform 102d and the first clamp arm 102e is thinner (i.e., narrower cross sectionally) than the corner junction between the second clamp arm 102f and the module-receiving platform 102d. The corner junction between the module-receiving platform 102d and the first clamp arm 102e is illustrated as corner junction 102g. Similarly, in FIG. 9, the first clamp arm 114e is thinner than the second clamp arm 114f. In addition, the corner junction between the module-receiving platform 114d and the first clamp arm 114e is thinner (i.e., narrower cross sectionally) than the corner junction between the second clamp arm 114f and the module-receiving platform 114d. The corner junction between the module-receiving platform 114d and the first clamp arm 114e is illustrated as corner junction 102g. Referring to FIG. 10, the first clamp arm 115e is thinner than the second clamp arm 115f. In addition, the corner junction between the module-receiving platform 115d and the first clamp arm 115e is thinner (i.e., narrower cross sectionally) than the corner junction between the second clamp arm 115f and the module-receiving platform 115d. The corner junction between the module-receiving platform 115d and the first clamp arm 115e is illustrated as corner junction 115g.

The corner junction 102g of FIG. 8, corner junction 114g of FIG. 9, and corner junction 115g of FIG. 10, acts as a hinge. They allow the first clamp arm to hinge outward when attaching to a solar module and then spring back once the solar module is attached.

National, regional, or local codes and regulations may require electrically conductive components to be electrically bonded and grounded. This is to protect roof installation crews, service personnel, and firefighters who may interact with a live solar module system that potentially has lethal electrical current. In order to facilitate electrical bonding, module-attachment clamp 102, module-attachment clamp 114, and splice body 115, of FIGS. 8, 9, and 10, respectively, include one or more electrical bonding screws. The bonding screws and the tip of the bonding screws extend through a ridge in respective module-receiving platforms. The ridge extends downward from, and lengthwise along, the module-receiving platform. The ridge provides a holding surface for the threads of the bonding screw. The tip of the bonding screw extends from the inside surface of the module-receiving platform and presses against the return flange of the frame of the solar module. FIG. 8 illustrates bonding screw 116, bond screw tip 116a, and ridge 102h. FIG. 9 illustrates bonding screw 117, bonding screw tip 117a, and ridge 114h. FIG. 10 illustrates bonding screw 118, bonding screw tip 118a, and ridge 115h.

Referring to FIG. 9, the mid clamp includes a second clamping portion 114i. Second clamping portion 114i can be a mirror image of clamping portion 114c. The second clamping portion includes first hook 114k, second hook 114m, module-receiving platform 114n, first clamp arm 114o, second clamp arm 114p, corner junction 114q, and ridge 114r. FIG. 9 also illustrates bonding screw 119. These are structurally equivalent and in the same structural relationship to their similarly-named counterparts in the clamping portion 114c.

Figure 14:
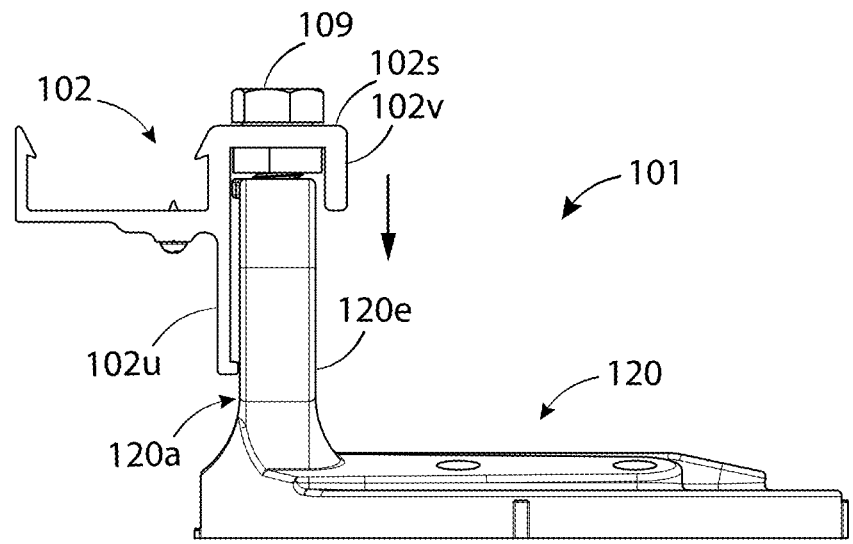
FIGS. 14 and 15 illustrate height adjustment of the end clamp.
Figure 16:
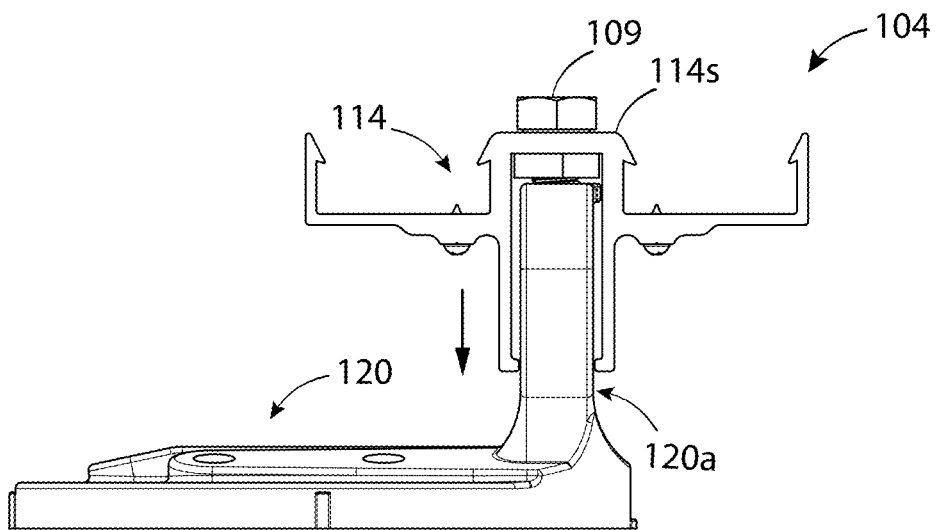
FIGS. 16 and 17 illustrate height adjustment of the mid clamp.

Referring to FIGS. 8 and 9, the module-attachment clamp 102 and the module-attachment clamp 114, respectively, each include a bracket-attachment portion. Referring to FIG. 14, the bracket-attachment portion 102s seats over the riser 120a of the roof-attachment bracket 120. Referring to FIG. 16, the bracket-attachment portion 114s seats over the riser 120a of the roof-attachment bracket 120. The bracket-attachment portion 102s of FIG. 8 and bracket-attachment portion 114s of FIG. 9 share common structural features.

Referring to FIG. 8, the bracket-attachment portion 102s of the module-attachment clamp 102 may include a top 102t extending away from the clamping portion 102c. A first bracket-attachment arm 102u, and a second bracket-attachment arm 102v, each extend downward from the top 102t. A slot 102w, is bound by the top 102t, the first bracket-attachment arm 102u, and the second bracket-attachment arm 102v. Referring to FIG. 9, the bracket-attachment portion 114s, of the module-attachment clamp 114, may include a top 114t. The top 114t extends between the clamping portion 114c and second clamping portion 114i. First bracket-attachment arm 114u, and second bracket-attachment arm 114v, each extend downward from the top 114t. Slot 114w, is bound by the top 114t, the first bracket-attachment arm 114u, and the second bracket-attachment arm 114v.

Referring to FIG. 8, a stop 102x extends inward from the first bracket-attachment arm 102u. In FIG. 9, a stop 114x extends inward from the first bracket-attachment arm 114u, and toward the second bracket-attachment arm 114v. A stop 114y extends inward from the second bracket-attachment arm 114v, and toward the first bracket-attachment arm 114u.

The module-attachment clamp 102 of FIG. 2 is illustrated as a one-piece or unitary body. Likewise, the module-attachment clamp 114 of FIG. 9 is illustrated as a unitary body as is the splice body 115 of FIG. 10.

Figure 11:
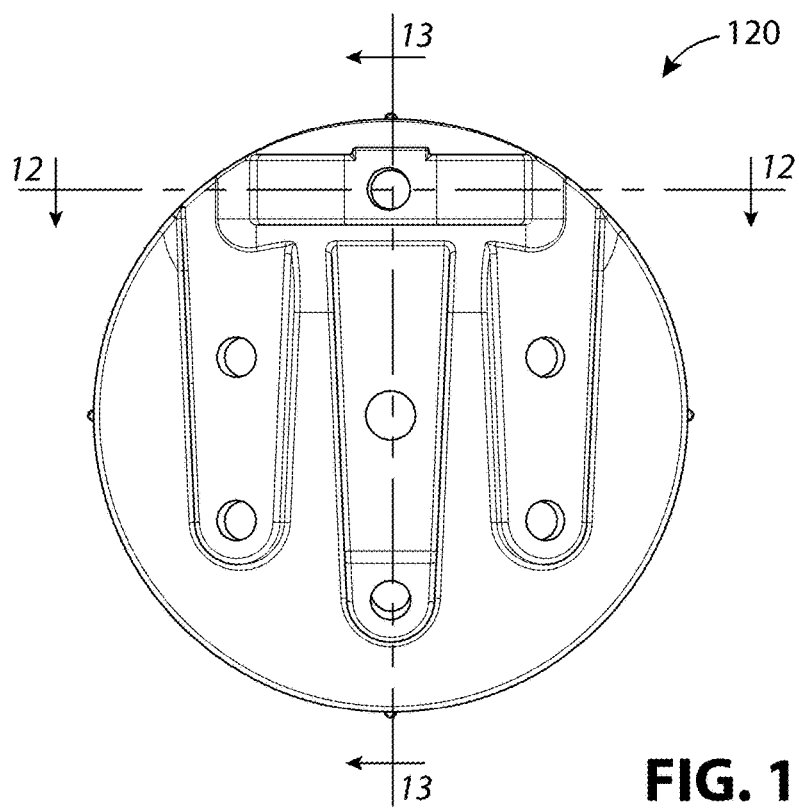
FIGS. 11, 12, and 13 illustrate, in various views, the roof-attachment bracket with FIGS. 12 and 13 illustrating sections of FIG. 11 taken along section lines 12-12 and 13-13, respectively.
Figure 12:
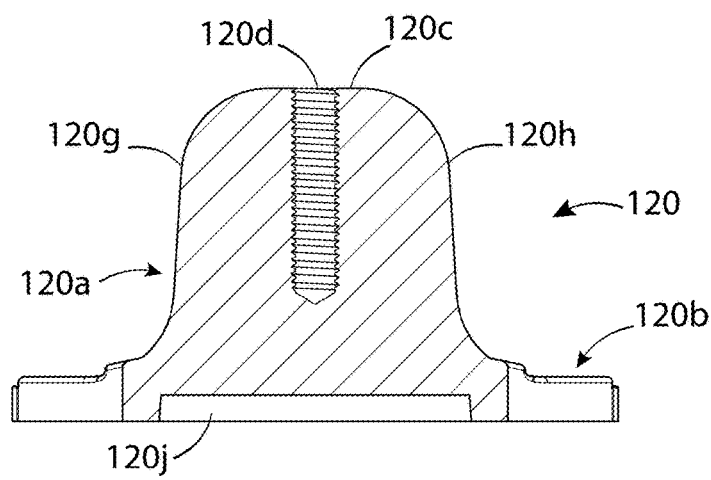
Figure 13:
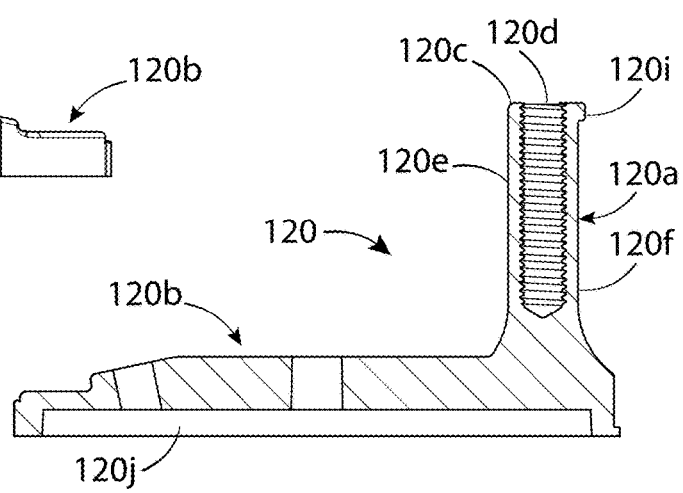
Figure 15:
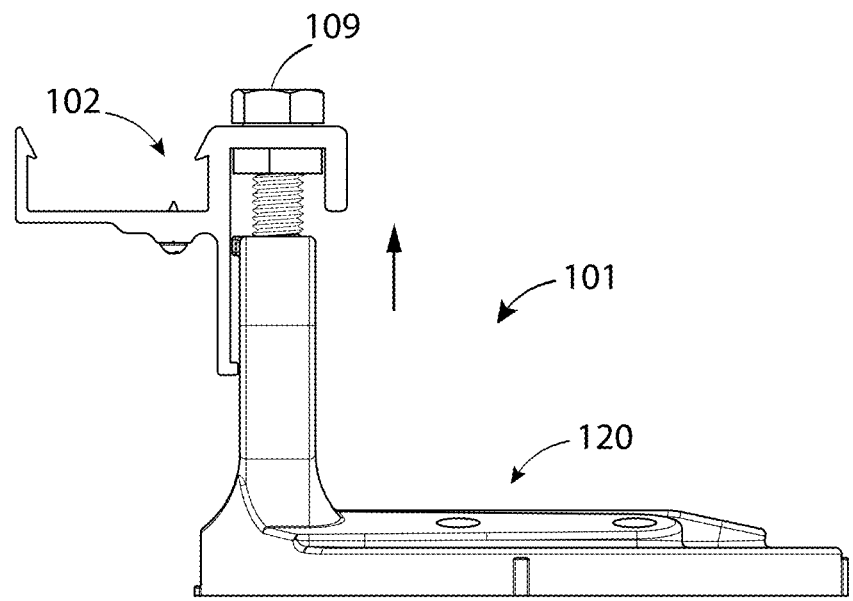
Figure 17:
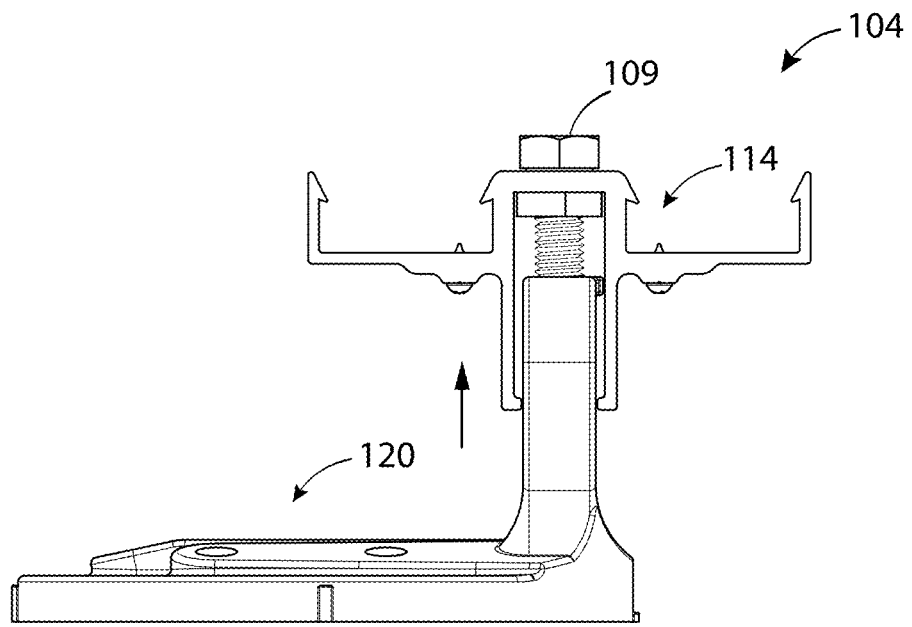

FIGS. 11-13 illustrate the roof-attachment bracket 120, instances of which, may be used for the end clamp and mid clamp. FIGS. 12 and 13 show sections of FIG. 11 taken along section lines 12-12 and 13-13, respectively. FIGS. 14 and 15 illustrate height adjustment of the end clamp 101. FIGS. 16 and 17 illustrate height adjustment of the mid clamp 104. Referring to FIGS. 12 and 13, the roof-attachment bracket 120, includes a base 120b, and a riser 120a extending upward from the base 120b. The base 120b is structured to seat on, and attach to, the roof. The riser 120a includes a riser-top 120c, forming a top surface of the riser 120a. A threaded aperture 120d extends downward into the riser 120a through the riser-top 120c. As illustrated, the threaded aperture is positioned within an interior space of the riser 120a.

Referring to FIG. 13, the roof-attachment bracket 120 includes a riser-front 120e and a riser-back 120f opposite the riser-front 120e. Referring to FIG. 12, the roof-attachment bracket 120 includes a first riser side 120g and a second riser side 120h, each extending between the riser-front 120e and the riser-back 120f of FIG. 13, and each extending from the base 120b to the riser-top 120c. As illustrated, the threaded aperture is positioned in an interior space of the riser. The interior space is enclosed by riser-front 120e and riser-back 120f of FIG. 13, and first riser side 120g and second riser side 120h of FIG. 12. The threaded aperture 120d may be fully positioned in the interior space of the riser with an opening at the riser-top 120c. The threaded aperture 120d may be a blind aperture as illustrated, in the riser-top 120c. FIGS. 12 and 13. Alternatively, the threaded aperture 120d may be a through-aperture that extends from riser-top 120c through the bottom of the base 120b. The threaded aperture may, for example, extend vertically downward, as illustrated. Referring to FIG. 13, a riser stop 120i extends rearward away from the riser 120a near the riser-top 120c.

Referring to FIGS. 12 and 13, the roof-attachment bracket 120 includes a hollow recess 120j within the bottom surface of the base 120b. The hollow recess 120j is sized and structured to receive a gasket or a combination of a gasket and sealant. The purpose of this gasket it to provide waterproofing over the roof penetrations. The roof penetrations are the result of roof-attachment fasteners that extend through the base 120b and into the roof. Examples of suitable gaskets include EDPM (Ethylene Propylene Diene Monomer) rubber, or Butyl rubber.

Referring to FIG. 13, the roof-attachment bracket 120 is illustrated as an L-bracket, or L-foot. The riser 120a forms one leg of the L-foot, and the base 120b forms the other leg.

Referring to FIG. 14 as the threaded fastener 109 is tightened, the module-attachment clamp 102 moves downward toward the roof-attachment bracket 120. This lowers an attached solar module toward the roof. In FIG. 15, the threaded fastener 109 is loosened, the module-attachment clamp 102 moves upward, away from the roof-attachment bracket 120. This raises the attached solar module away from the roof. Similarly, in FIGS. 16 and 17, as the threaded fastener 109 is tightened (FIG. 16), the module-attachment clamp 114 moves downward toward the roof-attachment bracket 120. Any attached solar modules would move downward toward the roof. As the threaded fastener 109 is loosened (FIG. 17), the module-attachment clamp 114 moves upward, away from roof-attachment bracket 120. Any attached solar modules would also move upward from the roof.

Figure 18:
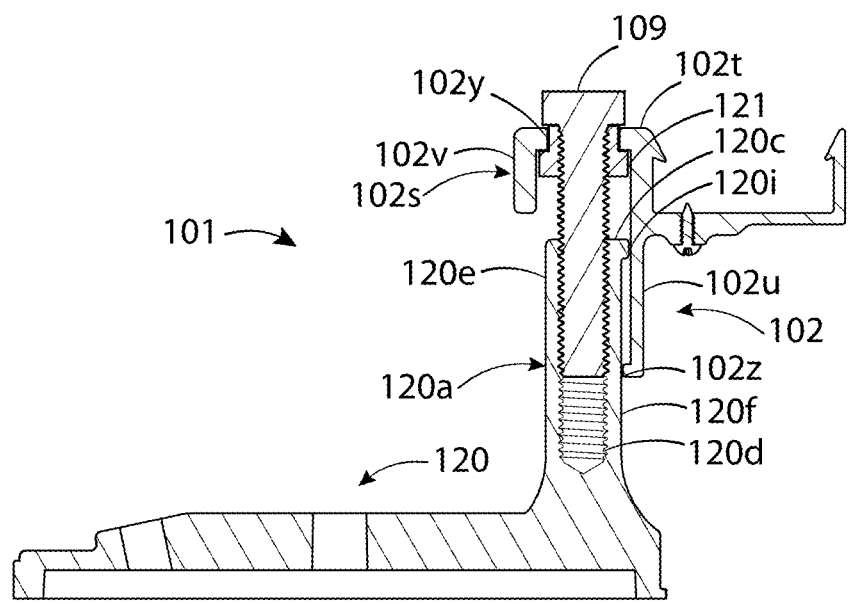
FIGS. 18 and 19 illustrate sections of the end clamp and mid clamp, respectively.
Figure 19:
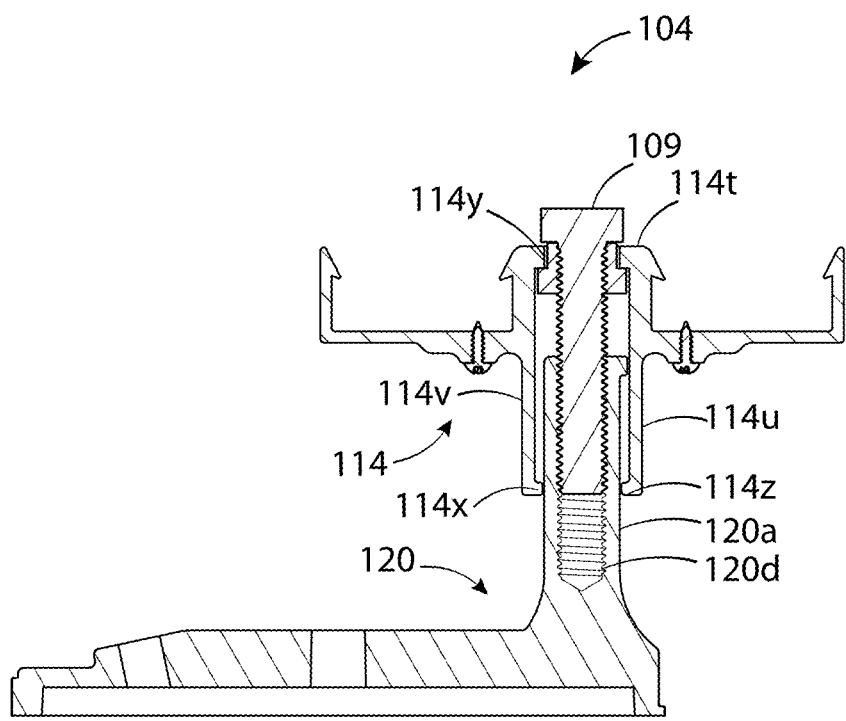

FIGS. 18 and 19 illustrate, in section view, how the height adjustment mechanism works. FIG. 18 illustrates a section view of the end clamp 101. Referring to FIG. 18, threaded fastener 109 extends through an aperture 102y in the top 102t of the bracket-attachment portion 102s of the module-attachment clamp 102. The threaded fastener 109 optionally engages a threaded retainer 121. In this example the threaded retainer 121 is in the form of a shoulder nut. The threaded fastener 109 threadedly engages the threaded retainer 121, and extends into the threaded aperture 120d in the riser 120a of the roof-attachment bracket 120. The top 102t of the bracket-attachment portion 102s extends over the riser-top 120c. The first bracket-attachment arm 102u extends over at least a portion of the riser-back 120f. The second bracket-attachment arm 102v is extendable over at least a portion of the riser-front 120e.

FIG. 14 illustrates the second bracket-attachment arm 102v extending over the riser-front 120e. The second bracket-attachment arm 102v acts as a front stop, and prevents excess forward rotation. The first bracket-attachment arm 102u acts as a back stop to prevent excess rearward rotation.

Referring back to FIG. 18, the first bracket-attachment arm 102u is spaced apart from the riser-back 120f by the stop 102z. The stop 102z extends inward from the first bracket-attachment arm 102u. The riser stop 120i extends outward from the riser-back 120f. The stop 102z and the riser stop 120i, help prevent the module-attachment clamp 102 from rotating downward (i.e., clockwise in FIG. 18) from the weight of the solar module.

FIG. 19 illustrates a section view of the mid clamp 104. FIG. 19, illustrates the relationship between the riser 120a and threaded aperture 120d of roof-attachment bracket 120, the threaded fastener 109, and module-attachment clamp 114. The mechanism is, as described above for FIG. 18, except the first bracket-attachment arm 114u, and second bracket-attachment arm 114v, both extend downward and over at least a portion of the riser 120a. They may also extend symmetrically downward. In addition, both the first bracket-attachment arm 114u, and second bracket-attachment arm 114v, include stops: stop 102z and stop 102x, respectively.

Components

Figure 20:
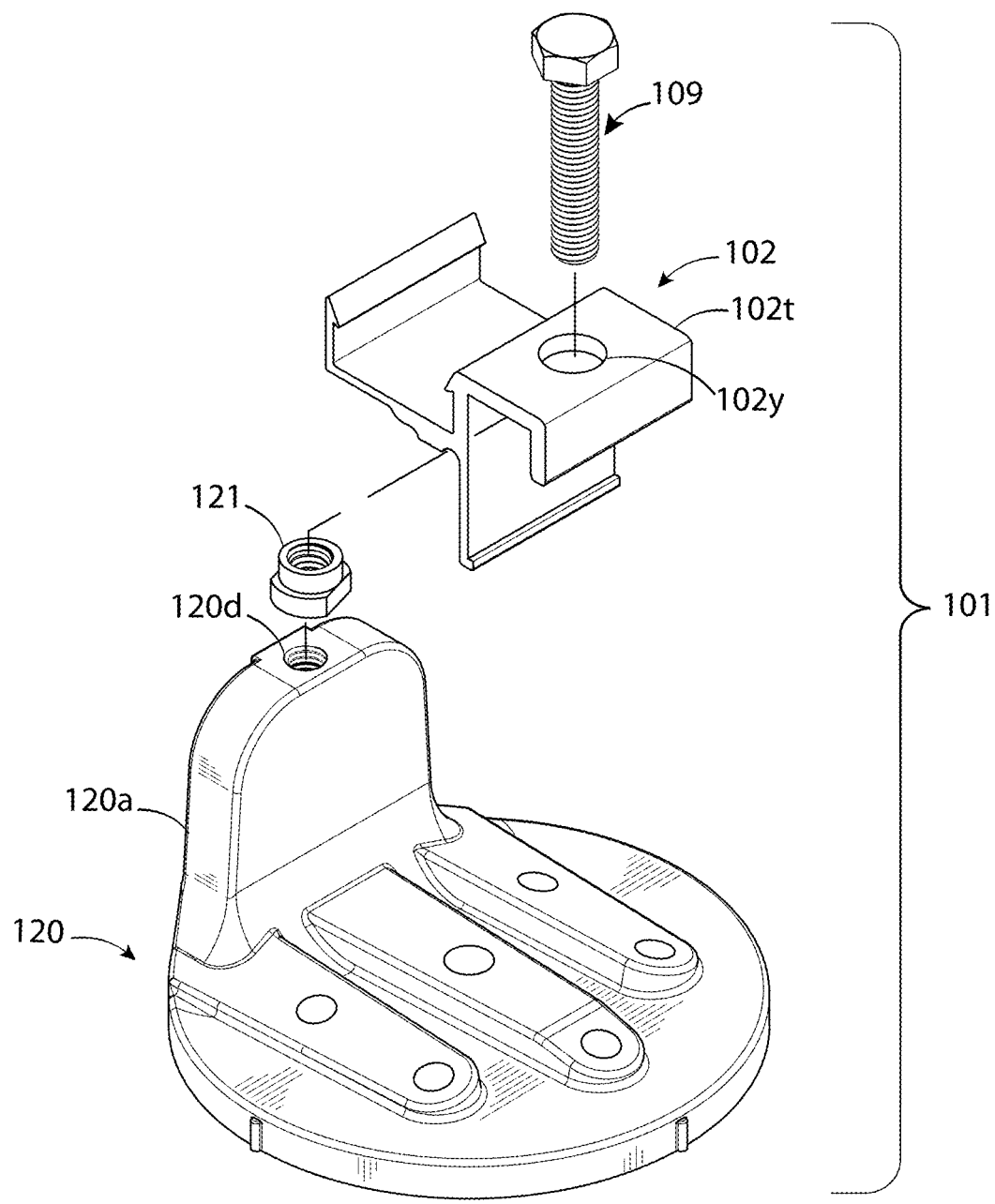
FIGS. 20, 21, and 22 illustrate the end clamp in exploded isometric view, front isometric view, and rear isometric view, respectively.
Figure 21:
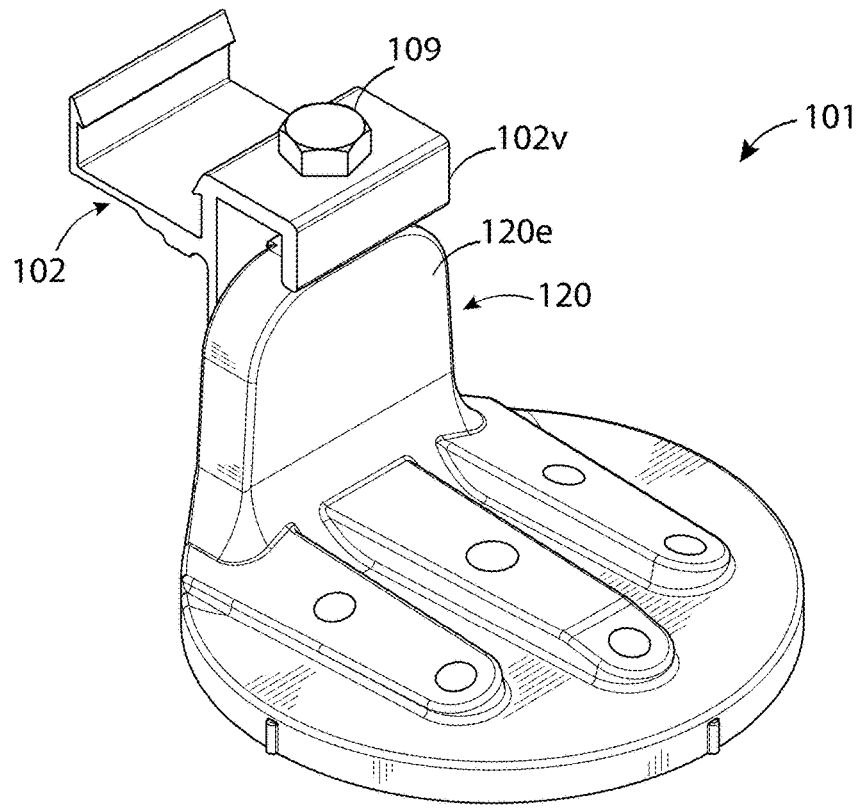
Figure 22:
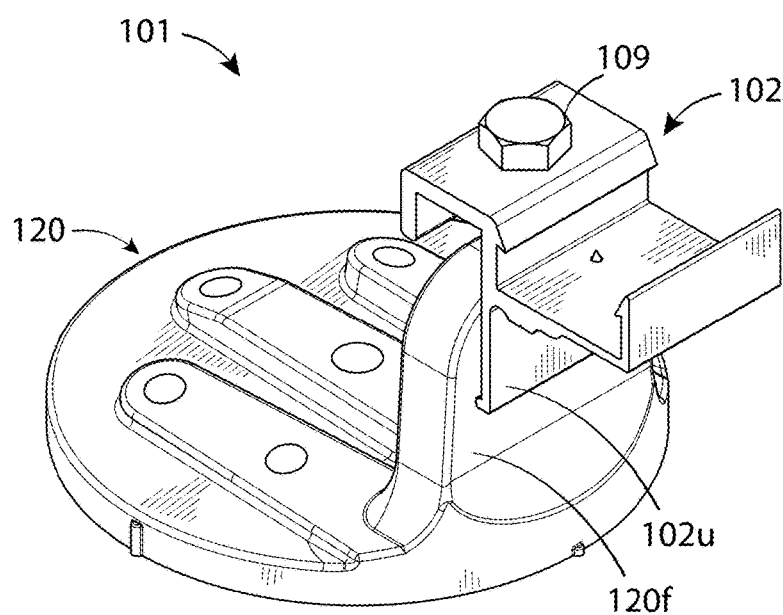

FIGS. 20-22 illustrate the end clamp 101 in exploded perspective view, front perspective view, and rear perspective view, respectively. FIGS. 20-22 illustrate the relationship between the module-attachment clamp 102, threaded fastener 109, and roof-attachment bracket 120. FIG. 21 illustrates the relationship between the second bracket-attachment arm 102v and the riser-front 120e. The second bracket-attachment arm 102v is extendable over at least a portion of the riser-front 120e. FIG. 22 shows the relationship between the first bracket-attachment arm 102u and the riser-back 120f. The first bracket-attachment arm 102u extends over at least a portion of the riser-back 120f. FIG. 20 illustrates the aperture 102y in the top 102t, the threaded aperture 120d in the riser 120a, and the threaded retainer 121.

Figure 23:
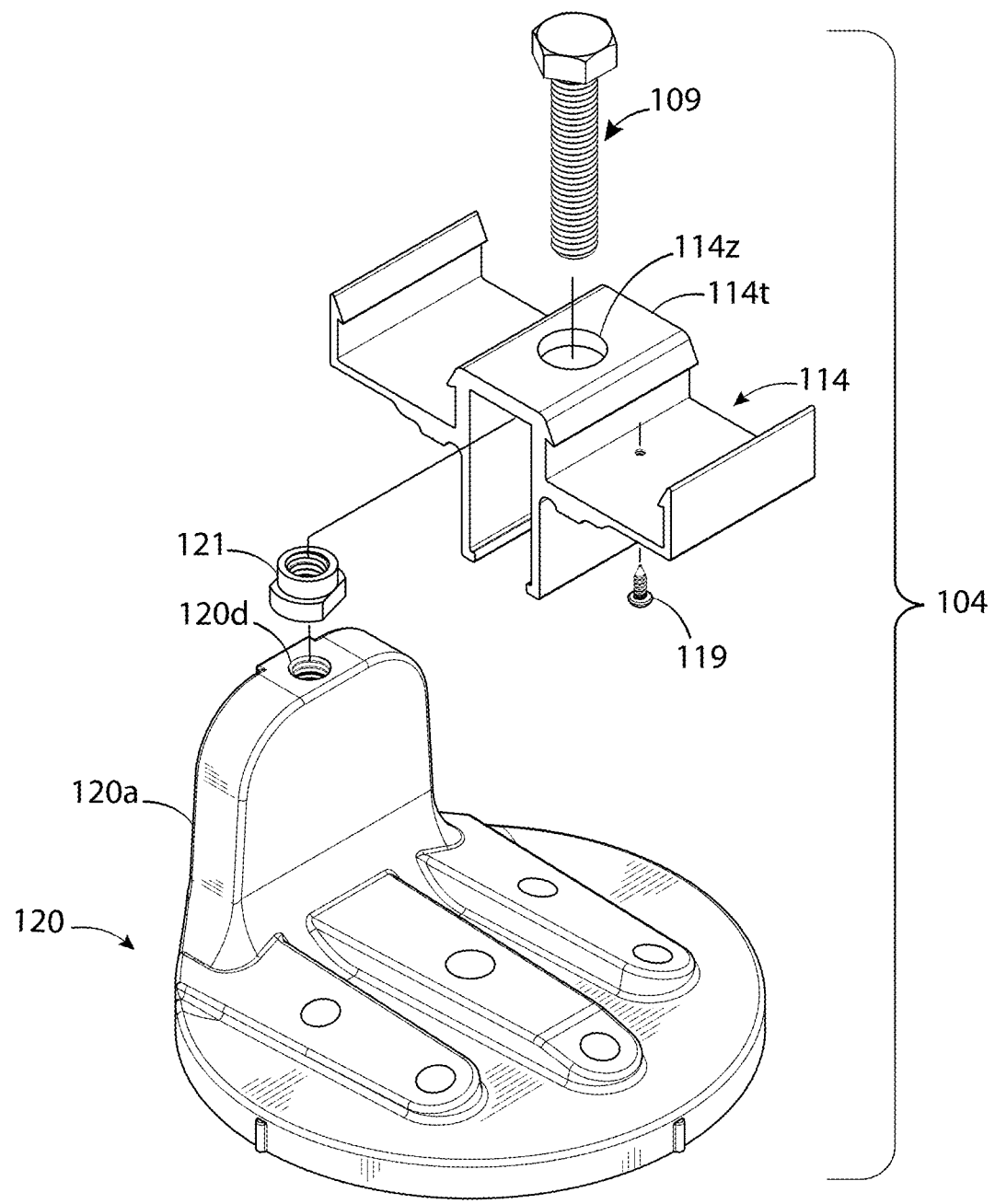
FIGS. 23, 24, and 25 illustrate the mid clamp in exploded isometric view, front isometric view, and rear isometric view, respectively.
Figure 24:
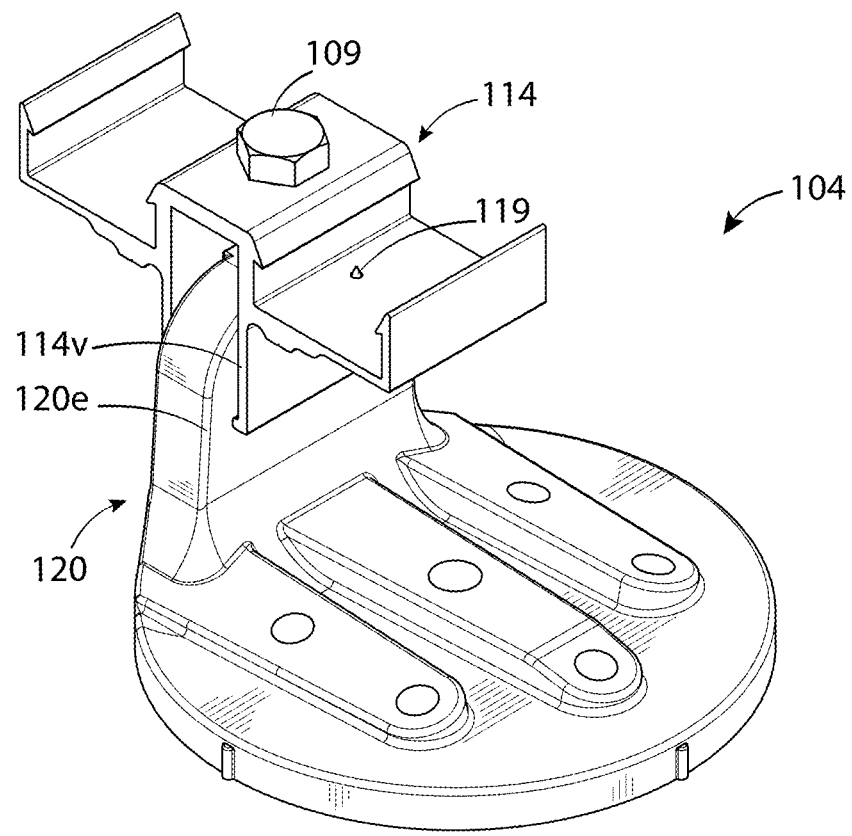
Figure 25:
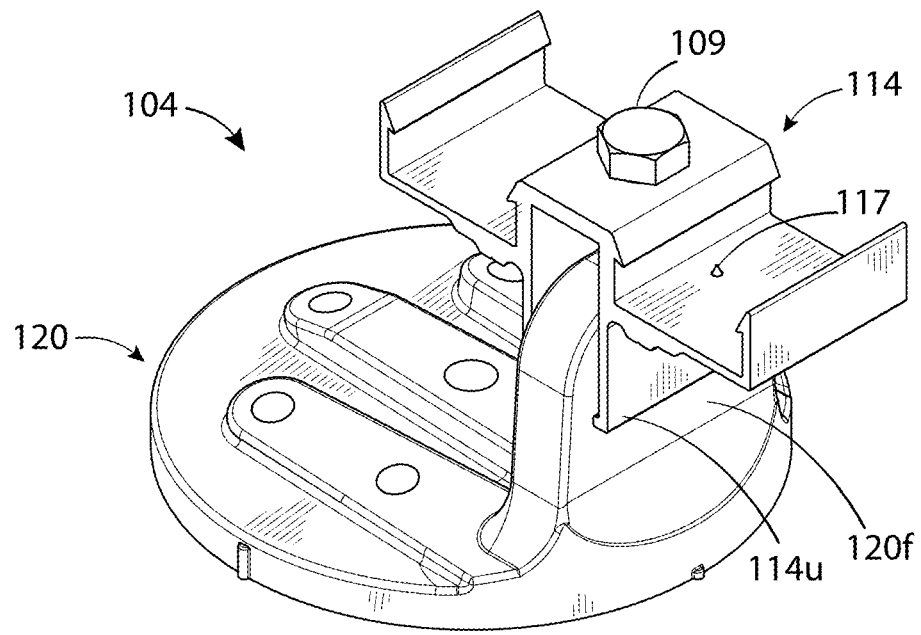

FIGS. 23-25 illustrate the mid clamp 104 in exploded perspective view, front perspective view, and rear perspective view, respectively. FIGS. 23-25 illustrate the relationship between the module-attachment clamp 114, threaded fastener 109, and roof-attachment bracket 120. FIG. 24 illustrates the relationship between the second bracket-attachment arm 114v and the riser-front 120e. The second bracket-attachment arm 114v extends over at least a portion of the riser-front 120e. FIG. 25 shows the relationship between the first bracket-attachment arm 114u and the riser-back 120f. The first bracket-attachment arm 114u extends over at least a portion of the riser-back. FIG. 23 illustrates the aperture 114z in the top 114t, the threaded aperture 120d in the riser 120a, and the threaded retainer 121.

Figure 26:
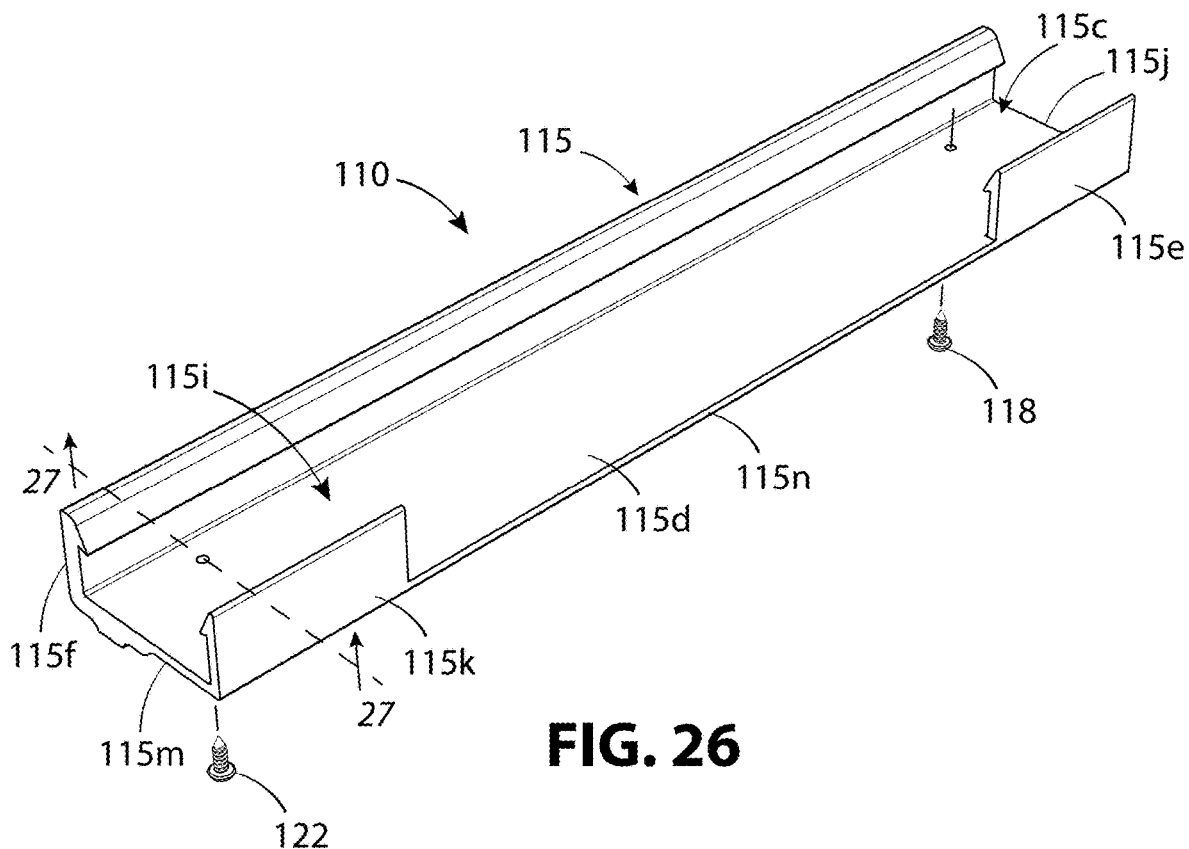
FIGS. 26 and 27 illustrate the bonding splice in exploded perspective view, and in section view, respectively.
Figure 27:
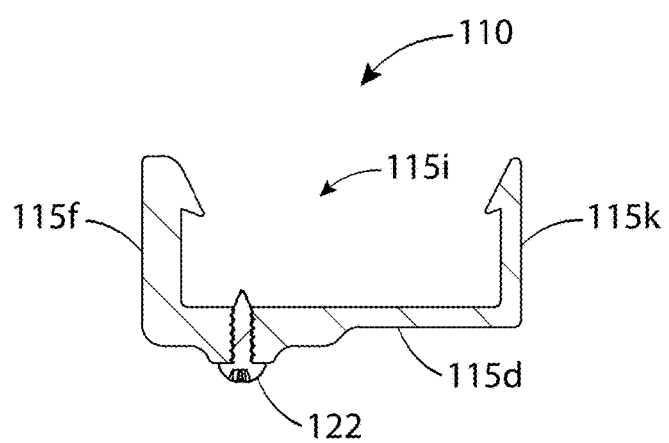

FIGS. 26 and 27 illustrate the bonding splice 110, with FIG. 26 illustrating the bonding splice in exploded perspective view, and FIG. 27 illustrating a section of FIG. 26 taken along section lines 27-27. Referring to FIG. 26, the splice body 115 includes a pair of clamping portions: first clamping portion 115c and second clamping portion 115i. Both clamping portions share a common clamp arm, second clamp arm 115f. The second clamp arm 115f is illustrated as continuous, lengthwise across the splice body 115. The second clamp arm 115f is to be positioned on the outside of the solar module frame. The first clamping portion 115c includes first clamp arm 115e positioned on the inside face of the splice body 115. The first clamp arm 115e is also positioned at a first lengthwise end 115j of the splice body 115. The second clamping portion 115i includes a third clamp arm 115k also positioned on the inside face of the splice body 115. It is positioned at a second lengthwise end 115m. A gap or opening 115n between the first clamp arm 115e and third clamp arm 115k, allows the bonding splice 110 to snap onto two solar modules. The continuous portion, the second clamp arm 115f, extends over the outside of the frame of both solar modules. As discussed in FIG. 10, the first clamp arm 115e hinges, while the second clamp arm 115f remains stationary. Referring to FIG. 27, the same is also true for the for the third clamp arm 115k. The third clamp arm 115k is thinner (i.e., narrower cross sectionally) than the second clamp arm 115f. The module-receiving platform 115d is thinner at the junction with third clamp arm 115k than at the junction with the second clamp arm 115f. In addition, the third clamp arm 115k is much shorter lengthwise than the second clamp arm 115f. For at least these reasons, the third clamp arm 115k will also tend to hinge under spring tension when snapped onto the solar modules. The second clamp arm 115f will remain stationary.

While bonding pins in the mid clamp can electrically bond solar modules in two adjacent rows, the bonding screws in the bonding splice 110 electrically bond solar modules within the same row. Referring to FIGS. 26 and 27, a bonding screw 122 extends into module-receiving platform 115d of the second clamping portion 115i. Bonding screw 118 extend through the first clamping portion 115c. Together, bonding screw 118 and bonding screw 122 electrically bond the two adjacent modules together in the same row.

Example Assembly Method

FIGS. 28-39 illustrate a non-limiting example of an assembly method utilizing the end clamp and mid clamp of this disclosure. In this assembly method, an installer would pre-assemble components to the solar modules and create solar module assemblies. The solar module assemblies are divided into two types: those that will be used in the first row of the solar module system, and those will be used in subsequent rows. An installer positions one or more first-row module assemblies along the front boundary of the solar module system. They installer may then secure them to the roof. The installer would then install non-first-row module assemblies in subsequent rows by snapping the front frame to the solar module assembly from the previous row.

The pre-assembly process can take place on ground level or on the roof. Typically, an installer would perform the preassembly at ground level. As a non-limiting example, they might perform the preassembly on a work surface such as a driveway, sidewalk, work bench, or against a wall. The installer would then carry or lift, by hand, or by mechanical assistance, the resultant solar module assemblies to the roof.

Figure 28:
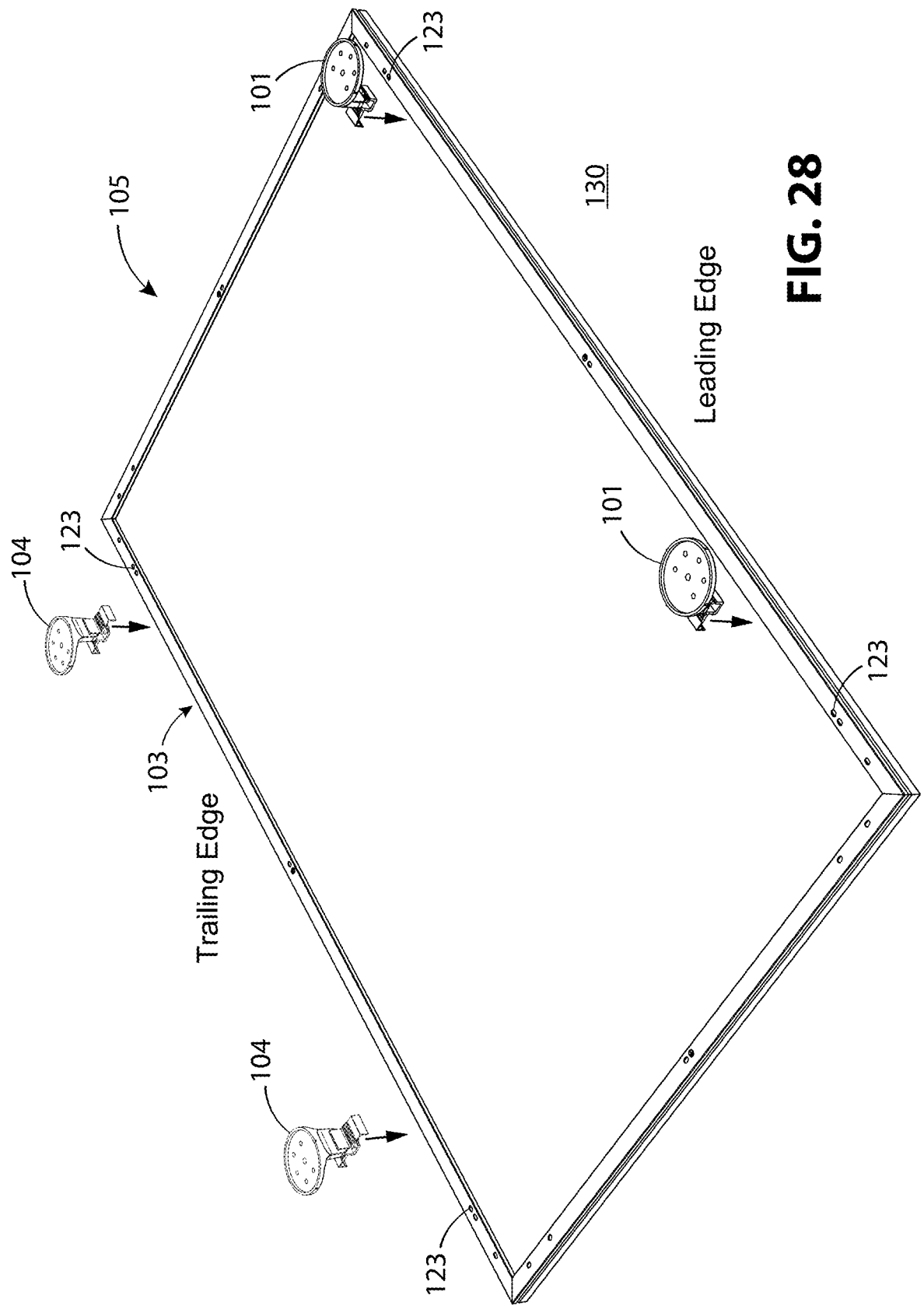

FIGS. 28-32 illustrate how to pre-assemble the first-row module assembly. Referring to FIGS. 28 and 29, with the module face down on a work surface 130, or against a wall, the installer attaches instances of end clamp 101 on the front edge ("leading edge") of the solar module 105. The installer attaches instances of mid clamp 104 on the back edge ("trailing edge") of solar module 105. Referring to FIG. 29, the installer aligns the clamping portion 102c of the end clamp 101, and the clamping portion 114c of the mid clamp 104, over the return flange 103d of the solar module 105. Referring to FIG. 28, the installer may opt to install the instances of the end clamp 101 and mid clamp 104 at predefined positions along the frame 103 of the solar module 105. For example, the installer could install the instances of end clamp 101 and mid clamp 104 to the corners of the modules. They could choose to attach the instances of the end clamp 101 and mid clamp 104 at, or near, reference marks on the solar module frame. An example of a reference mark are instances of manufacturer-provided mounting hole 123.

Figure 31:
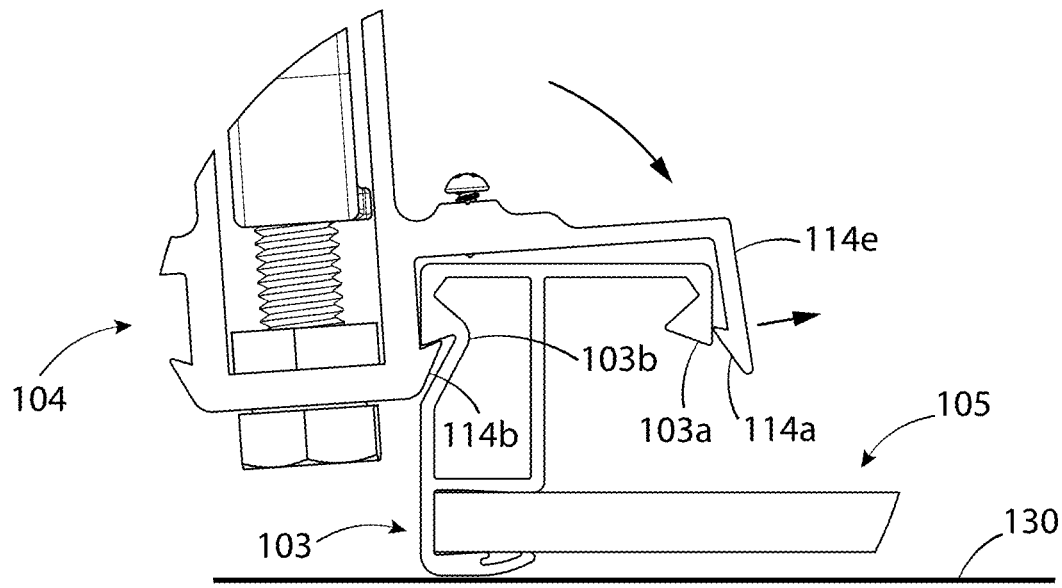
FIGS. 31 and 32 illustrate an enlarged portion of FIG. 30, showing an example of the sequence of snapping the mid-clamp into the frame of the solar module.
Figure 32:
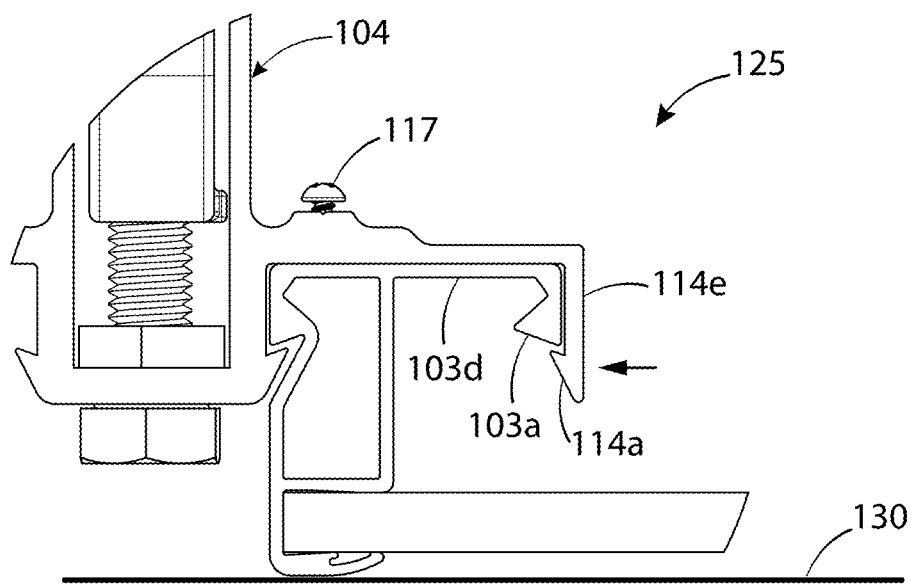

Referring to FIG. 30, the clamping portion 102c of the end clamp 101, and the clamping portion 114c of the mid clamp 104, are snapped into place, by spring tension, over the frame 103 of the solar module 105. FIGS. 31 and 32, which are enlarged portions of FIG. 30, illustrate this in more detail. Referring to FIG. 31, the installer may place the second hook 114b in the second detent 103b of the frame 103, and rotate the mid clamp 104 toward the solar module 105. As the first hook 114a engages the outside of the first detent 103a, the first clamp arm 114e hinges outward. FIG. 32 illustrates the resulting assembly, first-row module assembly 125. Referring to FIG. 32, once the first hook 114*a* clears the top of the first detent 103*a*, it snaps into place. The first clamp arm 114*e* returns to its resting position. The installer could then optionally tighten the bonding screw 117 against the return flange 103*d*. Alternatively, in FIG. 31, the installer might opt to push the mid clamp 104 straight down rather than rotating it in place. The assembly sequence illustrated in FIGS. 31 and 32 and the alternate "push and snap" sequence described in the last sentence, may also be applied to end clamp 101. This is because both the end clamp and the mid clamp share similar clamping structures.

Figure 33:
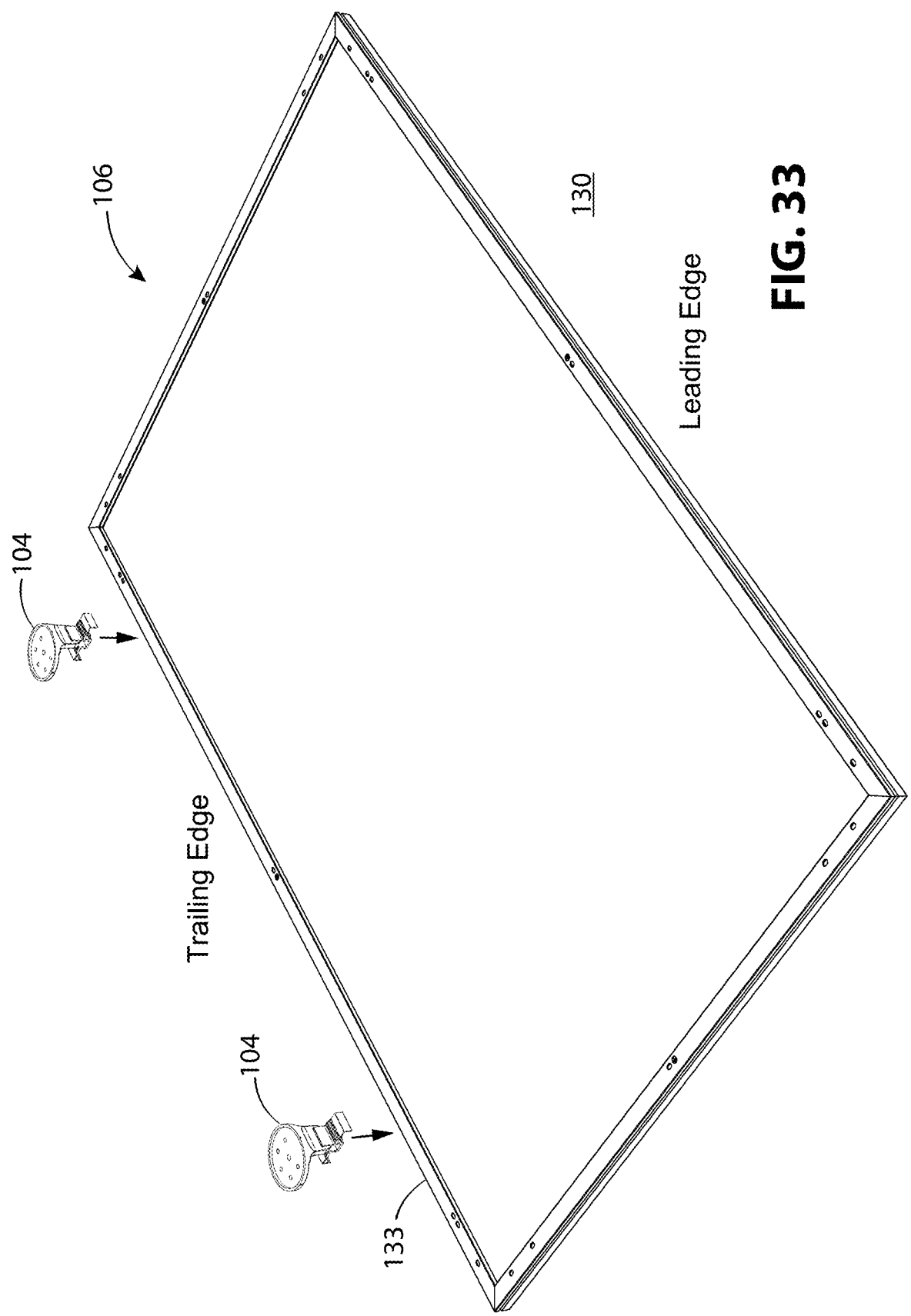
FIGS. 33-35 illustrate, in various views, the assembly steps for creating a non-first-row module assembly.
Figure 34:
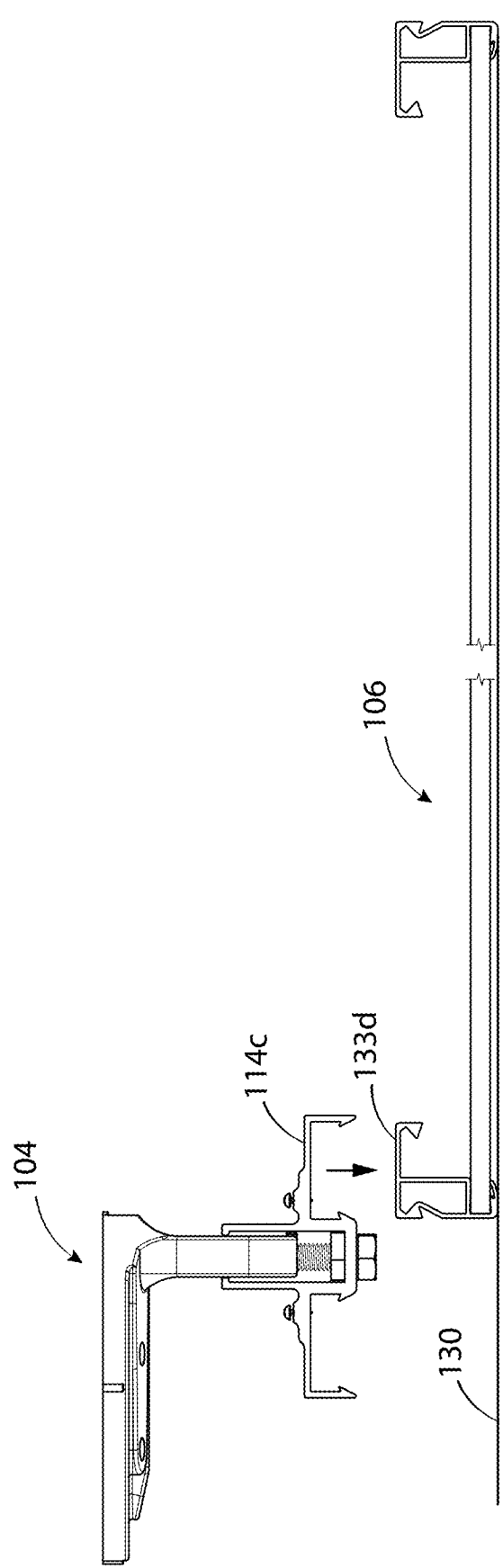
Figure 35:
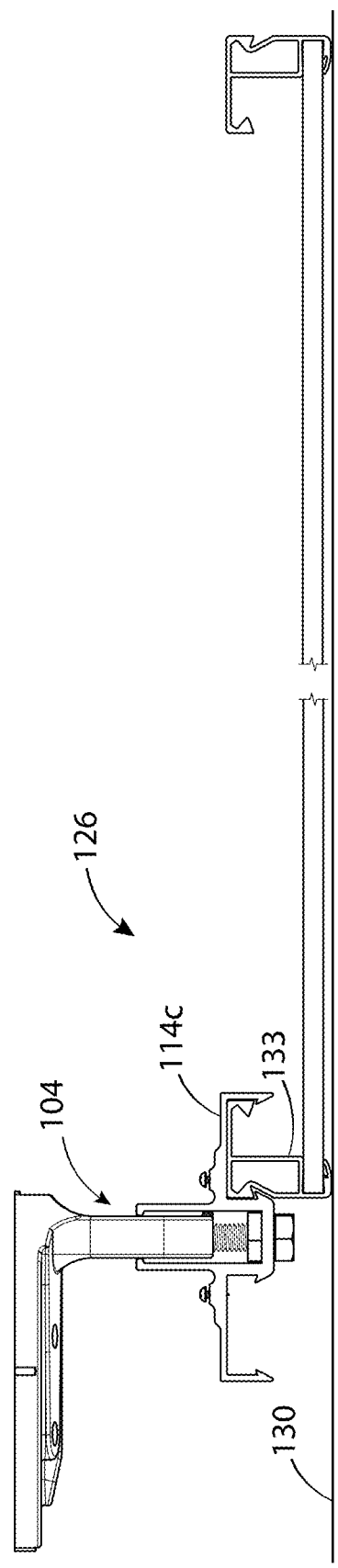

FIGS. 33-35 illustrate the assembly sequence for non-first-row solar module pre-assemblies. Referring to FIGS. 33 and 34, with the module face down on a work surface 130, or upright against a wall, the installer attaches instances of mid clamp 104 on the trailing edge of frame 133 of solar module 106. Referring to FIG. 34, the installer aligns the clamping portion 114*c* of the mid clamp 104 over the return flange 133*d*, as previously discussed. In FIG. 35, the installer snaps the clamping portion 114*c* of the mid clamp 104 against frame 133. They could do this, for example, using the rotational method, or pushing straight down, as previously discussed. The result is the non-first-row module assembly 126.

In FIGS. 28-30, the installer attaches the end clamp 101 to the solar modules as a unit. In FIGS. 28-35, the installer also attaches mid clamp 104 as a unit. Instead, an installer might optionally first attach the module-attachment clamps to the solar modules. With the module-attachment clamps installed, they would then attach the roof-attachment brackets to the module-attachment brackets.

With at least one first-row module assembly, pre-assembled, the installer may then install the first-row assembly, or assemblies, to the roof. The installer would typically mark where they want the leading-edge of the first-row modules to be placed on the roof. For example, they might snap a chalk line, or draw a line. They might use a reference point, like the edge of the shingles, to place the first row of solar modules. The installer would then simply place a first-row module assembly on the roof, feet down, i.e., with the bases of the roof attachment brackets placed against the roof surface. They may then secure the solar module to the roof using roof-attachment fasteners, such as decking screws or lag screws. The installer may then install additional solar module assemblies either row-by-row or column-by-column. For example, if they choose to install row-by-row, they would then install the remaining first row module assemblies as described in this paragraph. After the first row is installed, the installer could then install each subsequent row by the method described below for FIGS. 36-39. If the installer opted to install column-by-column, the installer would then install a module in the immediate adjacent row, and then each subsequent row using the method described below until the column was complete. They would then install each additional column in a similar manner.

Figure 38:
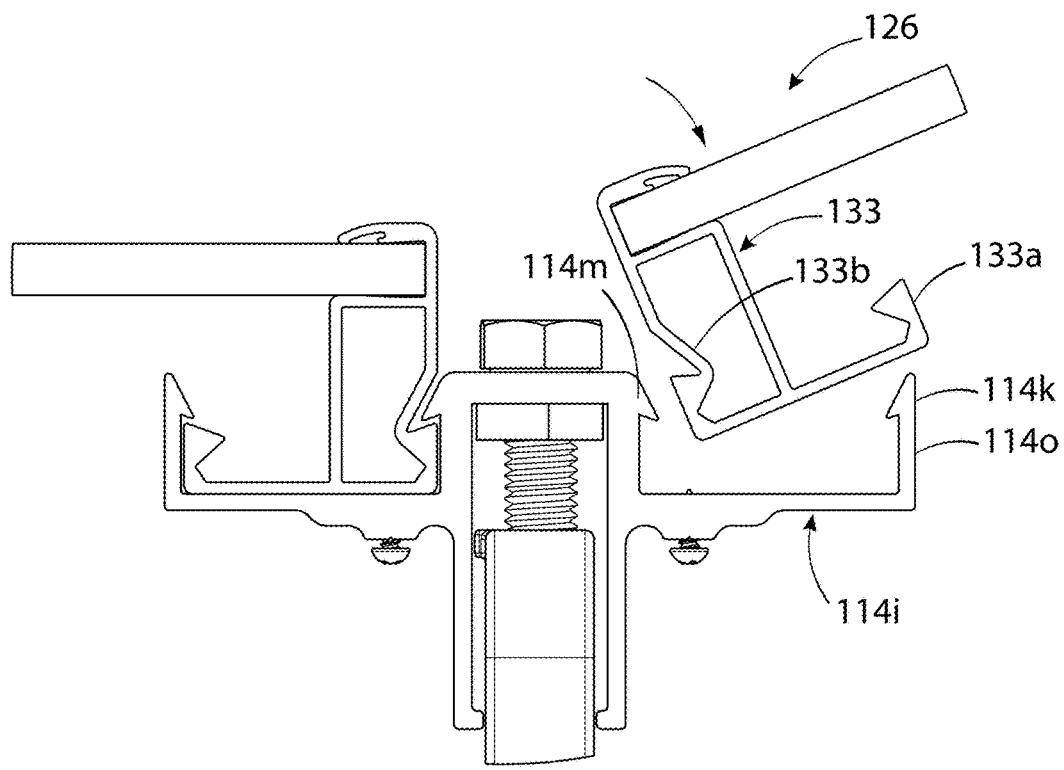
FIGS. 38 and 39 illustrate an enlarged portion of FIGS. 36 and 37, respectively.
Figure 39:
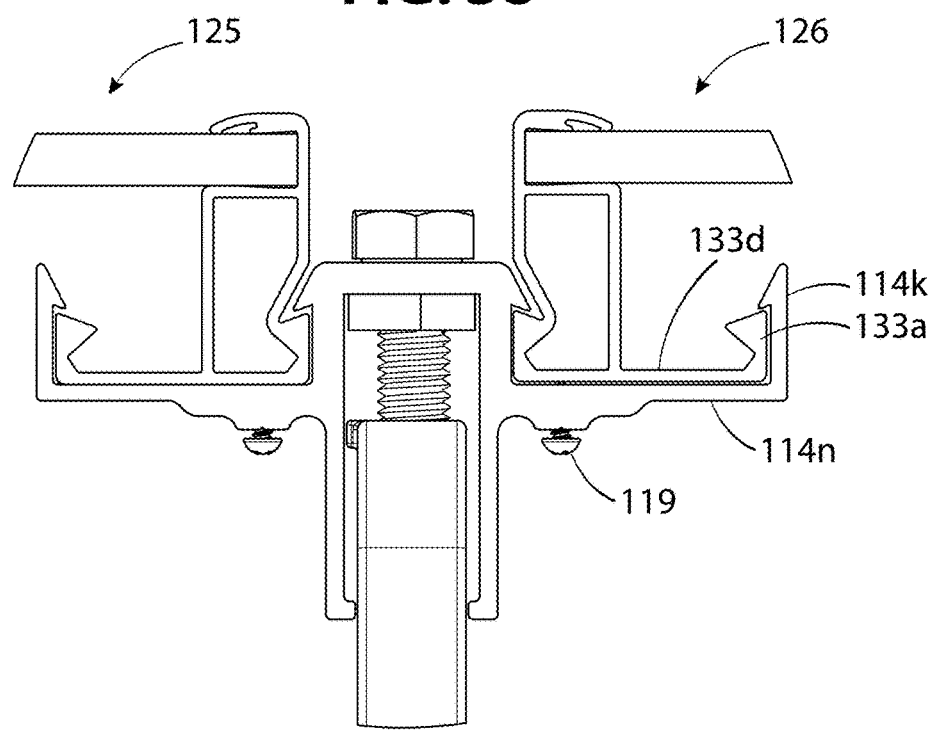

FIGS. 36-39 illustrate attaching a non-first-row assembly to an assembly in a previous row. In this example, the roof-attached assembly is a first-row assembly, but the steps outlined in these figures can also apply to subsequent rows. Referring to FIG. 36, the installer attaches the non-first-row module assembly 126 to the module assembly from the previous row by rotating the frame 133 into the second clamping portion 114*i*. In this case the previous row is the first-row module assembly 125. Referring to FIG. 38, an installer could align the second detent 133*b* of the non-first-row module assembly 126 with the second hook 114*m*. Once they catch the second detent 133*b* in the second hook 114*m*, they could rotate the non-first-row module assembly 126. As the non-first-row module assembly 126 rotates, the first clamp arm 114*o* hinges outward, as the first hook 114*k* presses against the first detent 133*a*. As rotation continues, the frame 103 snaps into place in the second clamping portion 114*i*. FIG. 39 shows the resulting assembly detail. The first hook 114*k* is snapped over the first detent 133*a*, and the return flange 133*d* is seated directly against the module-receiving platform 114*n*. Referring to FIG. 37, with the non-first-row module assembly 126 snapped into the first-row module assembly 125, the installer then may secure the non-first-row module assembly 126 to the roof. Typically, they would extend roof attachment fasteners through the roof-attachment bracket 120 and into the roof deck or roof rafters. Referring to FIG. 39, the installer may then tighten the bonding screw 119 to electrically bond the non-first-row module assembly 126 to the first-row module assembly 125. The installer installs modules in subsequent rows using the same steps discussed in this paragraph.

CONCLUSION AND VARIATIONS

The Summary, Detailed Description, and figures described devices, systems, and methods for attaching solar module assemblies to roofs. This disclosure provides examples of devices, components, and configurations to help the reader understand the described general principles. The following are examples of variations and combinations of different components, structures, and features that still adhere to the general principles.

The solar module system 100 of FIG. 1 is illustrated with instances of end clamp 101 secured to the front edge of the solar module system boundary. The installer may install mid clamps or end clamps on the front edge boundary or rear edge boundary of the solar module system. For example, the solar module system might include mid clamps but no end clamps. The solar module system might include mid clamps on the interior (i.e. between modules) and end clamps on the module front and rear boundaries. The solar module system might include mid clamps on the front edge boundary and end clamps on the rear edge boundaries. An installer could mix end clamps and mid clamps on the boundaries. Any of these combinations is within the scope of this disclosure.

The roof-attachment bracket can have additional variations. For example, the roof-attachment bracket could have a rectangular base or a rectangular riser. The roof-attachment bracket could be a T-foot. The roof-attachment bracket is illustrated as an L-foot or L-bracket having a one-piece or unitary body. A one-piece body has many advantages, such as lower part count, and fewer fasteners to attach, and possibly greater strength. However, it may alternatively be a multi-piece body. As illustrated the L-foot would typically be cast as a unitary body. It could alternatively, be structured for extrusion as a unitary body or a multi-piece body. It may also be 3D printed. These and other equivalent structures could be substituted that utilize an equivalent height-adjustment mechanism, are capable of being used in accordance with the disclosed assembly methods, and have sufficient holding force to withstand normal environmental conditions for solar module systems.

The instances of threaded fastener 109 in FIGS. 20, 23 and illustrated throughout this disclosure are suggestive of what could be used. These threaded fasteners are illustrated as hex head machine screws. This screw head style allows the installer to use a power tool such as an electric drill or impact driver. The Inventors envision that other types of screws could be used. For example, an installer could use socket head cap screws, pan-head screws, button-head screws, or round head screws. These can include hexagonal sockets, Phillips head sockets, slotted sockets, hi-torque sockets, square sockets, Robertson head sockets, or Torx head sockets. They can also include various custom or off-the-shelf security head screws. Any screw or bolt can be used that can perform the function specified in the specification, and provide enough holding strength to perform to typical environmental conditions expected for a solar module system installation.

The instances of the roof-attachment fastener 127 illustrated in FIGS. 36 and 37, and as well as roof-attachment fasteners discussed in this disclosure, are typically hex head decking screws. This screw head style is compatible with common power or hand tools. The installer could choose threaded roof fasteners with other head styles that suits power tools or hand tools. For rafter installations, an installer may substitute a lag bolt or lag screw for added strength. An installer can substitute screws or bolts that can perform the specified function, help facilitate a watertight seal, and provide enough holding strength to meet environmental and regulatory conditions expected for their installation.

Threaded apertures, such as threaded aperture 120*d* of FIGS. 12 and 13, may be directly threaded into the riser 120*a*. They may be indirectly threaded, for example, by using a threaded insert that is press fit into an unthreaded hole through the riser-top 120*c*. The threaded retainer 121 of FIGS. 18, 20, and 23, is illustrated as a shoulder nut. The threaded retainer could be a t-nut, sleeve nut, or other threaded retainers capable of engaging the aperture 102*y* of FIG. 20 or aperture 114*z* of FIG. 23 and retaining the threaded fastener 109.

The frame 103 illustrated in FIGS. 2, 31 and throughout this disclosure is one example of a solar module frame suitable for attachment to the clamp portion of the module-roof attachment assembly. Other examples of solar module frames suitable for use with the components in this disclosure include the frames of FIGS. 11, 15, and 19 of the Applicant's U.S. Pat. No. 11,757,400. The Inventors conceive that the system will integrate with other solar modules with frames that include a first detent in the outward-facing surface of their frame, and a second detent extending from the return flange.

The solar module frames and module-roof attachment assemblies in this disclosure are typically aluminum extrusions. Extruded aluminum is durable, electrically conductive, and can have enough strength for typical solar module systems. The Inventors conceive of extruding the solar module frames and module-roof attachment assemblies, from other electrically conductive materials or non-electrically conductive materials. They also conceive of using other manufacturing processes such as molding, 3D printing, or casting. Suitable materials could include steel or electrically conductive plastics, non-electrically conductive thermal plastic, or thermoset polyurethane.

The bonding screws described above typically are threaded fasteners with sharpened tips that allows them to pierce the oxide or paint layers. These threaded fasteners are shown as pan-head self-tapping screws with Philips sockets. However, they can be any threaded fastener capable of creating electrical bonding between two electrically-conductive materials. For example, the threaded fasteners can be self-tapping screws, sheet metal screws, or self-drilling screws. Any head style can be used that allows the threaded fastener to tighten sufficiently to create an electrical bond. For example, the threaded fastener can be hex head, socket head, or pan-head. The socket can be Philips, Torx, hexagonal (i.e., Allen head), square, or Robertson.

Throughout this disclosure, unless otherwise indicated, reference to a roof type can equally apply to other building structures.

The variations described, the general principles taught, and undescribed variations, devices, and systems that encompass the general principles described in this disclosure, are within the claim's scope.

The invention claimed is:

1. A railless solar mounting device for clamping a solar module to a roof, comprising:
 a roof-attachment bracket, shaped as an L-bracket, including a base structured to seat on and attach to the roof, and a riser extending upward from the base;
 the riser includes a riser-top forming a top-most surface of the riser, a riser-front, a riser-back opposite the riser-front, and a threaded aperture extending downward into the riser through the riser-top between the riser-front and the riser-back, the base extending outward from the riser-front;
 a module-attachment clamp having a unitary body, including a clamping portion and a bracket-attachment portion;
 the clamping portion including a module-receiving platform, a first clamp arm and a second clamp arm extending upward from the module-receiving platform, the clamping portion structured to seat a return flange of a frame of the solar module directly against the module-receiving platform and is structured to secure to the return flange and to an outside surface of the frame;
 the bracket-attachment portion includes a top seated over the riser-top, a first bracket-attachment arm extending downward from the top and over the riser-front, and a second bracket-attachment arm extending over the riser-back and extending downward from the top opposite the first bracket-attachment arm, the clamping portion extending laterally away from the first bracket-attachment arm; and
 a threaded fastener extending through the top of the bracket-attachment portion and into the threaded aperture.

2. The railless solar mounting device of claim 1, wherein:
 the clamping portion includes a first hook extending downward from a first end of the first clamp arm toward the module-receiving platform and a second hook extending downward from a second end of the second clamp arm toward the module-receiving platform.

3. The railless solar mounting device of claim 1, further comprising:
 a threaded retainer seated against the riser-top and against a lower surface of the top of the bracket-attachment portion; and
 the threaded fastener extends through the threaded retainer and into the threaded aperture of the riser.

4. The railless solar mounting device of claim 1, further comprising:
 the top of the bracket-attachment portion further includes an aperture therethrough;
 a threaded retainer seated against the riser-top, against a lower surface of the top of the bracket-attachment portion, and extending into the aperture; and
 the threaded fastener extends through the threaded retainer and into the threaded aperture of the riser.

5. The railless solar mounting device of claim 1, wherein:
the module-attachment clamp further includes a second clamping portion including a second module-receiving platform, a third clamp arm and a fourth clamp arm extending upward from the second module-receiving platform, the second clamping portion structured to seat a second return flange of a second frame of a second solar module directly against the second module-receiving platform and is structured to secure to the second return flange and to a second outside surface of the second frame, and the second clamping portion extending laterally away from the second bracket-attachment arm.

6. The railless solar mounting device of claim 5, wherein:
the clamping portion includes a first hook extending downward from a first end of the first clamp arm toward the module-receiving platform and a second hook extending downward from a second end of the second clamp arm toward the module-receiving platform; and
the second clamping portion includes a third hook extending downward from a third end of the third clamp arm toward the second module-receiving platform and a fourth hook extending downward from a fourth end of the fourth clamp arm toward the second module-receiving platform.

7. The railless solar mounting device of claim 5, further comprising:
a threaded retainer seated against the riser-top and against a lower surface of the top of the bracket-attachment portion; and
the threaded fastener extends through the threaded retainer and into the threaded aperture of the riser.

8. The railless solar mounting device of claim 5, further comprising:
the top of the bracket-attachment portion further includes an aperture therethrough;
a threaded retainer seated against the riser-top, against a lower surface of the top of the bracket-attachment portion, and extending into the aperture; and
the threaded fastener extends through the threaded retainer and into the threaded aperture of the riser.

* * * * *